(12) United States Patent
Seo et al.

(10) Patent No.: US 9,978,777 B2
(45) Date of Patent: May 22, 2018

(54) DISPLAY DEVICE INCLUDING THIN FILM TRANSISTOR ARRAY PANEL AND MANUFACTURING METHOD THEREOF

(71) Applicant: Samsung Display Co., Ltd., Yongin-si, Gyeonggi-do (KR)

(72) Inventors: Tae An Seo, Yongin-si (KR); Su Bin Bae, Yongin-si (KR); Yu-Gwang Jeong, Yongin-si (KR); Hyun Min Cho, Yongin-si (KR); Shin Il Choi, Yongin-si (KR); Jin Hwan Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/392,888

(22) Filed: Dec. 28, 2016

(65) Prior Publication Data

US 2017/0200747 A1  Jul. 13, 2017

(30) Foreign Application Priority Data

Jan. 11, 2016  (KR) .................. 10-2016-0003082

(51) Int. Cl.
*H01L 27/12* (2006.01)
*H01L 29/66* (2006.01)
*H01L 29/786* (2006.01)

(52) U.S. Cl.
CPC ........ *H01L 27/1225* (2013.01); *H01L 27/124* (2013.01); *H01L 27/1288* (2013.01); *H01L 29/66969* (2013.01); *H01L 29/7869* (2013.01)

(58) Field of Classification Search
CPC ............. H01L 27/1225; H01L 29/7869; H01L 29/66969; H01L 27/124; H01L 27/1288
See application file for complete search history.

(56) References Cited

U.S. PATENT DOCUMENTS

2014/0054592 A1* 2/2014 Gu .................... G02F 1/134363
257/71

FOREIGN PATENT DOCUMENTS

| KR | 10-0243284 | 3/2000 |
|---|---|---|
| KR | 10-2004-0061206 | 7/2004 |
| KR | 10-2002-0074701 | 2/2008 |
| KR | 10-1012491 | 2/2011 |
| KR | 10-1098274 | 12/2011 |
| KR | 10-2013-0015229 | 2/2013 |
| KR | 10-2013-0015251 | 2/2013 |
| KR | 10-2014-0140412 | 12/2014 |
| KR | 10-1479480 | 1/2015 |
| KR | 10-2015-0027434 | 3/2015 |
| KR | 10-2015-0056376 | 5/2015 |

* cited by examiner

*Primary Examiner* — Roy Potter
*Assistant Examiner* — Paul Patton
(74) *Attorney, Agent, or Firm* — Knobbe Martens Olson & Bear LLP

(57) ABSTRACT

A TFT array panel of a display device includes a first substrate, a first electrode disposed on the first substrate, a first insulating layer including a first hole, the first insulating layer disposed on the first electrode, a second insulating layer disposed on the first insulating layer and including a second hole corresponding to the first hole, and a capping layer including a first inner portion, the capping layer disposed on an inner lateral surface forming the second hole, where an end portion of the first inner portion disposed in the second hole is separated from the first electrode.

21 Claims, 29 Drawing Sheets

DISPLAY DEVICE INCLUDING THIN FILM TRANSISTOR ARRAY PANEL AND MANUFACTURING METHOD THEREOF

CROSS-REFERENCE TO RELATED APPLICATION

This application claims priority to, and the benefit of, Korean Patent Application No. 10-2016-0003082 filed in the Korean Intellectual Property Office on Jan. 11, 2016, the entire contents of which are incorporated herein by reference.

BACKGROUND

Field

The present disclosure relates to a display device including a thin film transistor array panel and a manufacturing method thereof.

Description of the Related Technology

A transistor, which is included in various electronic devices such as a display device, includes a gate electrode supplied with a gate signal, a source electrode supplied with a voltage, a drain electrode facing the source electrode, and a semiconductor electrically connected to the source electrode and the drain electrode.

When the transistor is a thin film transistor (TFT) including a plurality of thin films disposed on a substrate, insulating layers are disposed between electrode layers of the TFT and on the TFT. Such insulating layers may include at least one of an inorganic insulating material or an organic insulating material. An insulating layer disposed between electrode layers of a TFT usually includes an inorganic insulating material.

For each electrode of the TFT to be supplied with a voltage from, or transmit a voltage to, a signal line or an electronic element such as another TFT, the insulating layer disposed between electrode layers of a TFT or on the TFT includes a contact hole for connecting electrodes disposed at different layers from each other.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

If at least a portion of a material of an insulating layer disposed on a TFT to cover the TFT with reference to a substrate is different from a material of an insulating layer disposed between electrodes of the TFT, in a manufacturing process of forming contact holes in the insulating layer disposed between the electrodes of the TFT, a portion of the insulating layer covering the TFT is also removed to expose the electrode of the TFT. Thus a layer may remain on the exposed electrode of the TFT. Such a remaining layer increases contact resistance at the contact hole, which causes deterioration of the characteristics of the TFT. In addition, if a portion of the insulating layer covering the TFT becomes thin, the electrode of the TFT may be exposed and a short circuit may be generated.

Particularly, in a case that the insulating layer covering the TFT includes an organic insulating material, an influence by a remaining layer of the organic material may be more severe.

Accordingly, embodiments of the present disclosure are aimed at preventing loss of an insulating layer, particularly an insulating layer including an organic insulating material, disposed on a TFT during a manufacturing process of a TFT array panel, and therefore, for preventing increase of contact resistance at the contact hole of the insulating layer and deterioration of characteristics of the TFT.

Embodiments of the present disclosure are also aimed at preventing a short circuit between electrodes which are disposed above and below with reference to an insulating layer on the TFT.

An embodiment provides a display device including a TFT array panel, the TFT array panel including: a first substrate; a first electrode disposed on the first substrate; a first insulating layer including a first hole, the first insulating layer disposed on the first electrode; a second insulating layer disposed on the first insulating layer and including a second hole corresponding to the first hole; and a capping layer including a first inner portion, the capping layer disposed on an inner lateral surface forming the second hole, wherein an end portion of the first inner portion disposed in the second hole is separated from the first electrode.

A planar size of the second hole may be greater than a planar size of the first hole.

The capping layer may include an upper portion which is disposed on an upper surface of the second insulating layer and connected with the first inner portion.

The TFT array panel may further include a conductor disposed on the capping layer and connected with the first electrode through the first hole and the second hole.

The upper portion may include at least a portion overlapping the conductor and a portion not overlapping the conductor.

The TFT array panel may further include a third insulating layer disposed between the first insulating layer and the second insulating layer, and including a third hole corresponding to the first hole and the second hole, and a second electrode disposed between the first insulating layer and the third insulating layer, wherein the third insulating layer further includes a fourth hole disposed on the second electrode, wherein the second insulating layer further includes a fifth hole corresponding to the fourth hole, and wherein the capping layer further includes a second inner portion on an inner lateral surface forming the fifth hole.

The capping layer may include a cutout disposed on an upper surface of the second insulating layer.

A thickness of the first inner portion disposed in the second hole may not be uniform.

The inner lateral surface of the second insulating layer forming the second hole may include a first surface on which the first inner portion is disposed and a second surface facing the first surface, and wherein the capping layer may not be disposed on the second surface.

A thickness of the first inner portion may be thinner closer to the first substrate.

The capping layer may further include an upper portion disposed on an upper surface of the second insulating layer, and connected with the first inner portion.

The TFT array panel may further include a conductor which is disposed on the capping layer and connected with the first electrode through the first hole, wherein the conductor covers an upper surface of the upper portion.

The capping layer may not be disposed on an inner lateral surface of the first insulating layer forming the first hole.

An embodiment provides a manufacturing method for a display device including a TFT array panel, the method including: forming a first electrode on the first substrate;

forming a first insulating layer on the first electrode; forming a second insulating layer on the first insulating layer; forming a first hole in the second insulating layer; forming a capping layer on the second insulating layer; removing a portion of the capping layer disposed in the first hole; and forming a second hole corresponding to the first hole by removing the first insulating layer corresponding to the removed portion of the capping layer in the first hole.

A photomask used for forming the first hole and a photomask used for removing the portion of the capping layer disposed in the first hole may be the same.

A photomask used when removing the portion of the capping layer disposed in the first hole may include three regions with different transmittances from each other.

When removing of the portion of the capping layer disposed in the first hole, a cutout exposing an upper surface of the second insulating layer may be formed.

A thickness of the capping layer formed on the inner lateral surface of the second insulating layer forming the first hole may not be uniform.

The inner lateral surface of the second insulating layer forming the second hole may include a portion on which the capping layer is not formed.

A thickness of the capping layer formed on the inner lateral surface of the second insulating layer may be thinner closer to the first substrate.

The method may further include forming a conductor connected with the first electrode through the first hole and the second hole.

A portion of the capping layer may be removed such that an upper surface of the second insulating layer is exposed.

DETAILED DESCRIPTION OF CERTAIN INVENTIVE EMBODIMENTS

Figure 1:
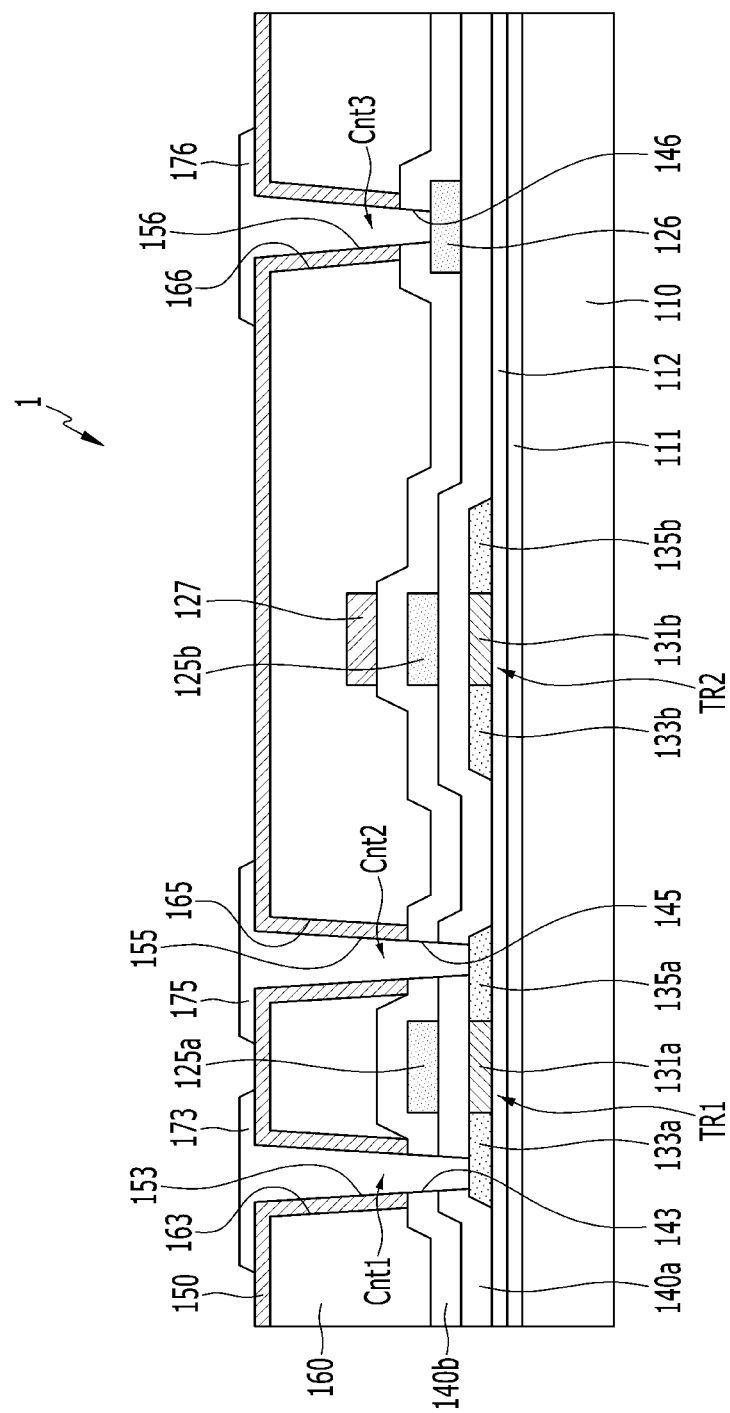
FIG. 1 and FIG. 2 are each a cross-sectional view of a TFT array panel of a display device according to an embodiment.

The present disclosure will be described more fully hereinafter with reference to the accompanying drawings, in which certain embodiments are shown. As those skilled in the art would realize, the described embodiments may be modified in various ways, without departing from the spirit or scope of the present invention.

In the drawings, the thickness of layers, films, panels, regions, and the like, may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Now, referring to FIG. 1 and FIG. 2, a thin film transistor (TFT) array panel of a display device according to an embodiment will be described.

Figure 2:
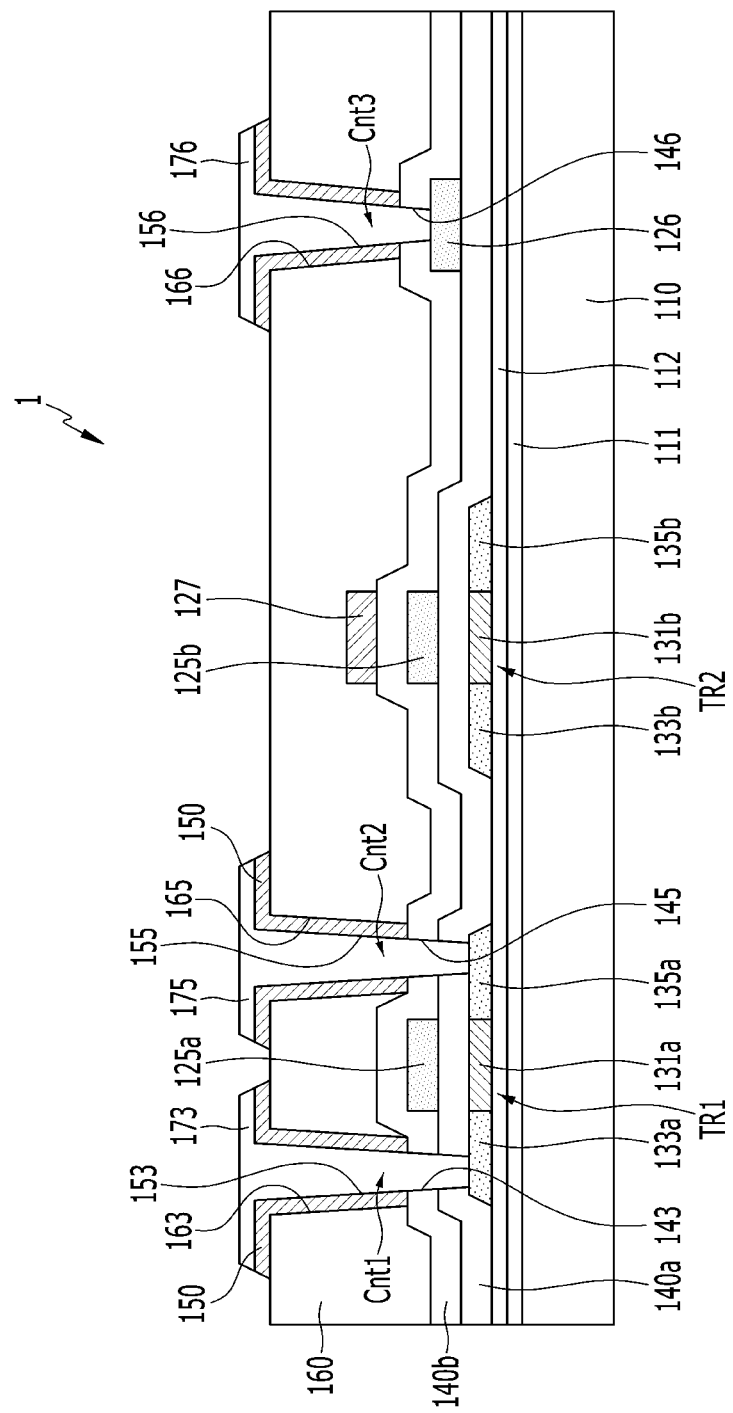

FIG. 1 and FIG. 2 are each a cross-sectional view of a TFT array panel of a display device according to an embodiment.

A TFT array panel 1 according to an embodiment is a panel which may be included in an electronic device, such as, for example, a display device. The TFT array panel 1 includes a plurality of thin film transistors disposed on a first substrate 110, which includes an insulating material. The TFT array panel 1 may be a flexible panel in some embodiments.

A direction which is parallel to a section of the first substrate 110 shown in FIG. 1 and FIG. 2 and in an upper direction in FIG. 1 and FIG. 2 will be referred to as a sectional direction, and a structure or view that is observed in the sectional direction will be referred to as a sectional structure or a sectional view herein. A direction in which a main surface of the first substrate 110 can be observed will be referred to as a plan direction, and a structure or view that is observed in the plan direction will be referred to as a plan structure or a plan view herein. When describing a stacking structure in the sectional view, a description that a constituent element is disposed on another element means herein that the constituent element is disposed on the another constituent element in a sectional direction.

The first substrate 110 may include an insulating material such as, for example, plastic and glass.

A second substrate 111 may be disposed on the first substrate 110. The second substrate 111 may be a flexible substrate including a material such as, for example, polyimide (PI).

Either one of the first substrate 110 and the second substrate 111 may be omitted in some embodiments. For example, if the TFT array panel 1 has flexibility so that the TFT array panel 1 may be bent or curved, the first substrate 110 may be omitted.

A buffer layer 112 may be disposed on the second substrate 111. The buffer layer 112 may prevent inflow of an impurity from the first substrate 110 or the second substrate 111 to an element disposed on the buffer layer 112, for example, to a semiconductor, which is included in a TFT, as described below, so that the buffer layer 112 may protect the semiconductor and improve characteristics of the TFT.

The buffer layer 112 may include an inorganic insulating material such as, for example, silicon oxide ($SiO_x$), silicon nitride ($SiN_x$), aluminum oxide ($Al_2O_3$), hafnium oxide ($HfO_3$), or yttrium oxide ($Y_2O_3$). The buffer layer 112 may be a single layer or multiple layers of two or more. FIG. 1 and FIG. 2 depict an example in which the buffer layer 112 is a single layer. Differently from FIG. 1 and FIG. 2, a portion of the buffer layer 112 may be removed. Alternatively, the buffer layer 112 may be omitted.

A plurality of TFTs TR1 and TR2 and a first conductor 126 are disposed on the buffer layer 112.

The TFT TR1 includes a gate electrode 125a, a semiconductor 131a, a source electrode 133a, a drain electrode 135a, and an insulating layer 140a which is disposed between the semiconductor 131a and the gate electrode 125a. The TFT TR2 includes a gate electrode 125b, a semiconductor 131b, a source electrode 133b, a drain electrode 135b, and the insulating layer 140a which is disposed between the semiconductor 131b and the gate electrode 125b.

The first insulating layer 140a may include an inorganic insulating material such as, for example, silicon oxide ($SiO_x$), silicon nitride ($SiN_x$), or silicon oxynitride ($SiO_xN_y$). The first insulating layer 140a may be a single layer or multiple layers of two or more.

The semiconductors 131a and 131b respectively overlap the gate electrodes 125a and 125b with the first insulating layer 140a interposed therebetween in a plan view, and in a sectional view shown in FIG. 1 and FIG. 2, the semiconductors 131a and 131b are respectively disposed corresponding to the gate electrodes 125a and 125b. Channels of the TFT TR1 and TR2 are respectively formed in each of the semiconductors 131a and 131b.

According to an embodiment, in each of the TFTs TR1 and TR2, the source electrodes 133a and 133b and the drain electrodes 135a and 135b are disposed at opposite sides with respect to the semiconductors 131a and 131b and are separated from each other. The source electrodes 133a and 133b and the drain electrodes 135a and 135b may be disposed at a same layer as the semiconductors 131a and 131b, and may be directly connected with the respective semiconductors 131a and 131b. However, embodiments are not limited thereto, and the source electrodes 133a and 133b and the drain electrodes 135a and 135b may be disposed at a different layer from the semiconductors 131a and 131b, and may be electrically connected to the semiconductors 131 and 131b, respectively.

In a case that the source electrodes 133a and 133b and the drain electrodes 135a and 135b are disposed at the same layer as the semiconductors 131a and 131b, the source electrodes 133a and 133b, the drain electrodes 135a and 135b, and the semiconductors 131a and 131b may include the same material, for example, a same oxide. The oxide included in the semiconductors 131a and 131b, the source electrodes 133a and 133b, and the drain electrodes 135a and 135b may include an oxide of a metal such as, for example, zinc (Zn), indium (In), gallium (Ga), tin (Sn), or titanium (Ti), or a combination of a metal such as, for example, zinc (Zn), indium (In), gallium (Ga), tin (Sn), or titanium (Ti), or an oxide thereof.

A carrier concentration of the source electrodes 133a and 133b and the drain electrodes 135a and 135b, which are conductors, is greater than a carrier concentration of the semiconductors 131a and 131b.

The source electrodes 133a and 133b and the drain electrodes 135a and 135b may include a reduced material of an oxide semiconductor included in the semiconductors 131a and 131b which form the channels of the TFTs TR1 and TR2. The source electrodes 133a and 133b and the drain electrodes 135a and 135b may further include at least one among fluorine (F), hydrogen (H), and sulfur (S), together with the oxide semiconductor included in the semiconductors 131a and 131b. Such source electrodes 133a and 133b and drain electrodes 135a and 135b may be formed by making the oxide semiconductor conductive with a method such as, for example, plasma treatment. For example, the oxide semiconductor may be doped with a gas including at least one of fluorine (F), hydrogen (H), or sulfur (S) in a chamber, such that the source electrodes 133a and 133b and the drain electrodes 135a and 135b according to an embodiment may be formed.

Such a structure of the source electrodes 133a and 133b, the drain electrodes 135a and 135b, and the semiconductors 131a and 131b is an example, and a structure of a TFT is not limited thereto.

The source electrodes 133a and 133b, the drain electrodes 135a and 135b, and the semiconductors 131a and 131b are disposed between the first insulating layer 140a and the buffer layer 112, and the gate electrodes 125a and 125b may be disposed over the first insulating layer 140a. Alternatively, the gate electrodes 125a and 125b may be disposed at a layer between the semiconductors 131a and 131b, and the first substrate 110.

The first conductor 126 may be disposed at the same layer as the gate electrodes 125a and 125b, in some embodiments.

A second insulating layer 140b is disposed over the TFTs TR1 and TR2 and the first conductor 126 with reference to the first substrate 110. The second insulating layer 140b may include an inorganic insulating material such as, for example, silicon oxide ($SiO_x$), silicon nitride ($SiN_x$), or silicon oxynitride ($SiO_xN_y$), and may be a single layer or multiple layers of two or more.

A second conductor 127 may be disposed on the second insulating layer 140b. The second conductor 127 may include a portion overlapping the gate electrode 125b with the second insulating layer 140b interposed therebetween. The second conductor 127 may be omitted in some embodiments. In such embodiments, the second insulating layer 140b may also be omitted.

A third insulating layer 160 is disposed on the second insulating layer 140b and the second conductor 127 with reference to the first substrate 110. The third insulating layer 160 may include an organic material. If the third insulating layer 160 includes an organic material, damage to the third insulating layer 160 when the TFT array panel 1 is bent can be reduced, so that flexibility of the TFT array panel 1 may be improved.

The third insulating layer 160, the second insulating layer 140b, and the first insulating layer 140a include contact holes Cnt1 and Cnt2 disposed on at least one of the electrodes of the TFTs TR1 and TR2, and a contact hole Cnt3 disposed on the first conductor 126 or the second conductor 127. FIG. 1 and FIG. 2 shows an example in which the contact hole Cnt1 is disposed on the source electrode 133a of the TFT TR1, the contact hole Cnt2 is disposed on the drain electrode 135a of the TFT TR1, and the contact hole Cnt3 is disposed on the first conductor 126, but the electrodes on which the contact holes Cnt1, Cnt2, and Cnt3 of the third insulating layer 160, the second insulating layer 140b, and the first insulating layer 140a are disposed are not limited thereto and there may be various different electrodes disposed between the third insulating layer 160 and the buffer layer 112.

The contact hole Cnt1 includes a hole 143 in the first insulating layer 140a and the second insulating layer 140b, and a hole 163 corresponding to and aligned with the hole 143. The contact hole Cnt2 includes a hole 145 in the first insulating layer 140a and the second insulating layer 140b, and a hole 165 corresponding to and aligned with the hole 145. The contact hole Cnt3 includes a hole 146 in the second insulating layer 140b, and a hole 166 corresponding to and aligned with the hole 146.

A planar size in a plan view of the hole 163 of the third insulating layer 160 may be greater than a planar size of the hole 143 of the first insulating layer 140a and the second insulating layer 140b at the contact hole Cnt1. A planar size of the hole 165 of the third insulating layer 160 may be greater than a planar size of the hole 145 of the first insulating layer 140a and the second insulating layer 140b at the contact hole Cnt2. A planar size of the hole 166 of the third insulating layer 160 may be greater than a planar size of the hole 146 of the second insulating layer 140b at the contact hole Cnt3. However, the planar sizes of the holes 163, 165, and 166 of the third insulating layer 160 are not limited thereto, and may be respectively similar to or less than planar sizes of the holes 143, 145, and 146 of the first and second insulating layers 140a and 140b corresponding to the respective holes 163, 165, and 166 of the third insulating layer 160.

A capping layer 150 is disposed on an upper or lateral surface of the third insulating layer 160. The upper surface of the third insulating layer 160 may be a surface which is substantially parallel to a main surface of the first substrate 110. The lateral surface of the third insulating layer 160 includes an inner lateral surface defining the holes 163, 165, and 166.

The capping layer 150 includes inner portions 153, 155, and 156 disposed on the inner lateral surface defining the holes 163, 165, and 166 of the third insulating layer 160. The inner portions 153, 155, and 156 are disposed on the inner lateral surface defining the holes 163, 165, and 166 of the third insulating layer 160, contact the inner lateral surface, and are not disposed on the inner lateral surface defining the holes 143, 145, and 146 of the first and second insulating layers 140a and 140b, in the contact holes Cnt1, Cnt2, and Cnt3. Accordingly, end portions of the inner portions 153, 155, and 156 disposed in the contact holes Cnt1, Cnt2, and Cnt3 are separated from the electrodes 133a and 135a or the first conductor 126 on which the contact holes Cnt1, Cnt2, and Cnt3 are disposed, and the separation distance may be similar to or greater than a thickness in the sectional direction of the first and second insulating layers 140a and 140b.

The inner portions 153, 155, and 156 of the capping layer 150 may be disposed on an entire area of the inner lateral surface defining the holes 163, 165, and 166 of the third insulating layer 160, but embodiments are not limited thereto, and the inner portions 153, 155, and 156 may be disposed on a portion of the inner lateral surface defining the holes 163, 165, and 166 of the third insulating layer 160.

Referring to FIG. 1 and FIG. 2, an edge of a lower end portion of the inner portions 153, 155, and 156 of the capping layer 150 may be aligned with an edge of the hole 143 of the first and second insulating layers 140a and 140b disposed below the edge of the lower end portion of the inner portions 153, 155, and 156. The inner surface of the inner portions 153, 155, and 156 of the capping layer 150 and the holes 143, 145, and 146 of the first and second insulating layers 140a and 140b may form the contact holes Cnt1, Cnt2, and Cnt3 together.

The capping layer 150 may include an upper portion which is disposed on the upper surface of the third insulating layer 160 and connected with the inner portions 153, 155, and 156. The upper portion may be connected with adjacent inner portions 153, 155, and 156.

A material of the capping layer 150 is not particularly limited, but may include, for example, an inorganic insulating material or a metal. In embodiments where the capping layer 150 includes an inorganic insulating material, an etching ratio of the inorganic insulating material of the capping layer 150 may be different from an etching ratio of an insulating material of the first and second insulating layers 140a and 140b.

At least one of the contact hole Cnt1 and the contact hole Cnt2 may be omitted depending on functions or types of the TFT TR1, and a contact hole (not shown) disposed on electrodes of the TFT TR2 may be formed in the third insulating layer 160, the second insulating layer 140b, and the first insulating layer 140a depending on functions or types of the TFT TR2.

A plurality of data conductors 173, 175, and 176 are disposed on the capping layer 150. The data conductor 173 is electrically connected with the source electrode 133a of the TFT TR1 through the contact hole Cnt1, the data conductor 175 is electrically connected with the drain electrode 135a of the TFT TR1 through the contact hole Cnt2, and the data conductor 176 is electrically connected with the first conductor 126 through the contact hole Cnt3.

According to an embodiment shown in FIG. 1, the capping layer 150 may include a surface not covered by the data conductors 173, 175, and 176. In this case, a material included by the data conductors 173, 175, and 176 may be different from a material included by the capping layer 150. Particularly, the data conductors 173, 175, and 176 may include a material having an etching ratio which is different from an etching ratio of a material of the capping layer 150. The capping layer 150 may cover an upper surface of the third insulating layer 160 except for an inner surface of the contact holes Cnt1, Cnt2, and Cnt3.

According to an embodiment shown in FIG. 2, the capping layer 150 and the data conductors 173, 175, and 176 together may expose an upper surface of the third insulating layer 160. In this case, the data conductors 173, 175, and 176 and the capping layer 150 may include materials having similar etching ratios to each other. In a case that the capping layer 150 has conductivity, the capping layer 150 may form an electrode together with each of the data conductors 173, 175, and 176.

A passivation layer (not shown) may be disposed on the data conductors 173, 175, and 176.

Now, referring to FIG. 3 to FIG. 7 as well as FIG. 1 and FIG. 2, a manufacturing method of a TFT array panel of a display device according to an embodiment will be described.

FIG. 3 to FIG. 7 are each cross-sectional views sequentially showing processes of a manufacturing method of a TFT array panel of a display device according to an embodiment.

Figure 3:
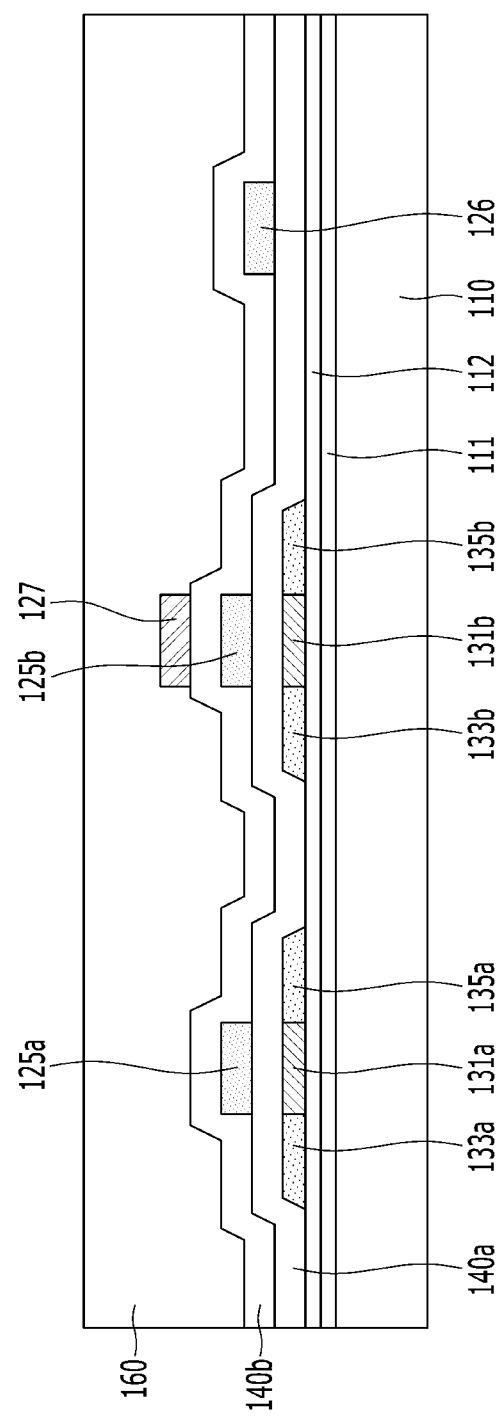
FIG. 3 to FIG. 7 are each a cross-sectional view sequentially showing processes of a manufacturing method of a TFT array panel of a display device according to an embodiment.

First referring to FIG. 3, a second substrate 111 is formed on a first substrate 110, and a buffer layer 112 is formed by depositing an inorganic insulating material such as, for example, silicon oxide ($SiO_x$), silicon nitride ($SiN_x$), aluminum oxide ($Al_2O_3$), hafnium oxide ($HfO_3$), or yttrium oxide ($Y_2O_3$) with a method such as, for example, chemical vapor deposition (CVD) on the second substrate 111.

Then, a semiconductor material layer is deposited on the buffer layer 112 and patterned to form a semiconductor layer (not shown). The semiconductor material may include, for example, an oxide semiconductor material such as zinc oxide (ZnO), zinc tin oxide (ZTO), zinc indium oxide (ZIO), indium oxide (InO), titanium oxide (TiO), indium gallium zinc oxide (IGZO), indium zinc tin oxide (IZTO), or the like, but is not limited thereto. After forming the semiconductor layer, a portion of the semiconductor layer may be turned into source electrodes 133a and 133b and drain electrodes 135a and 135b by reducing a portion of the semiconductor layer or doping a portion of the semiconductor layer with an impurity. Remaining portions of the semiconductor layer that has not turned into the source electrodes 133a and 133b and the drain electrodes 135a and 135b form the semiconductors 131a and 131b.

Next, a first insulating layer 140a is formed on the first substrate 110 with the semiconductor layer by depositing an inorganic insulating material such as, for example, silicon oxide ($SiO_x$), silicon nitride ($SiN_x$), or silicon oxynitride ($SiO_xN_y$).

Then, a conductive material such as for example a metal is deposited on the first insulating layer 140a to form a conductive layer, and the conductive layer is patterned to form gate electrodes 125a and 125b and a first conductor 126.

Subsequently, the semiconductor layer not covered by the gate electrodes 125a and 125b, in a plan view, may be treated with a method such as a heat treatment or a plasma treatment, to form the source electrodes 133a and 133b and the drain electrodes 135a and 135b. In this case, the step of reducing or doping with an impurity of a portion of the semiconductor layer before forming of the first insulating layer 140a may be omitted.

A second insulating layer 140b is then formed by depositing an inorganic insulating material such as, for example, silicon oxide ($SiO_x$), silicon nitride ($SiN_x$), or silicon oxynitride ($SiO_xN_y$) on the first substrate 110.

Then, a conductive material such as a metal is deposited on the second insulating layer 140b to form a conductive layer, and the conductive layer is patterned to form a second conductor 127.

An insulating material is then deposited on the second insulating layer 140b and the second conductor 127 to from a third insulating layer 160. The third insulating layer 160 may include an organic material and have photosensitivity.

Figure 4:
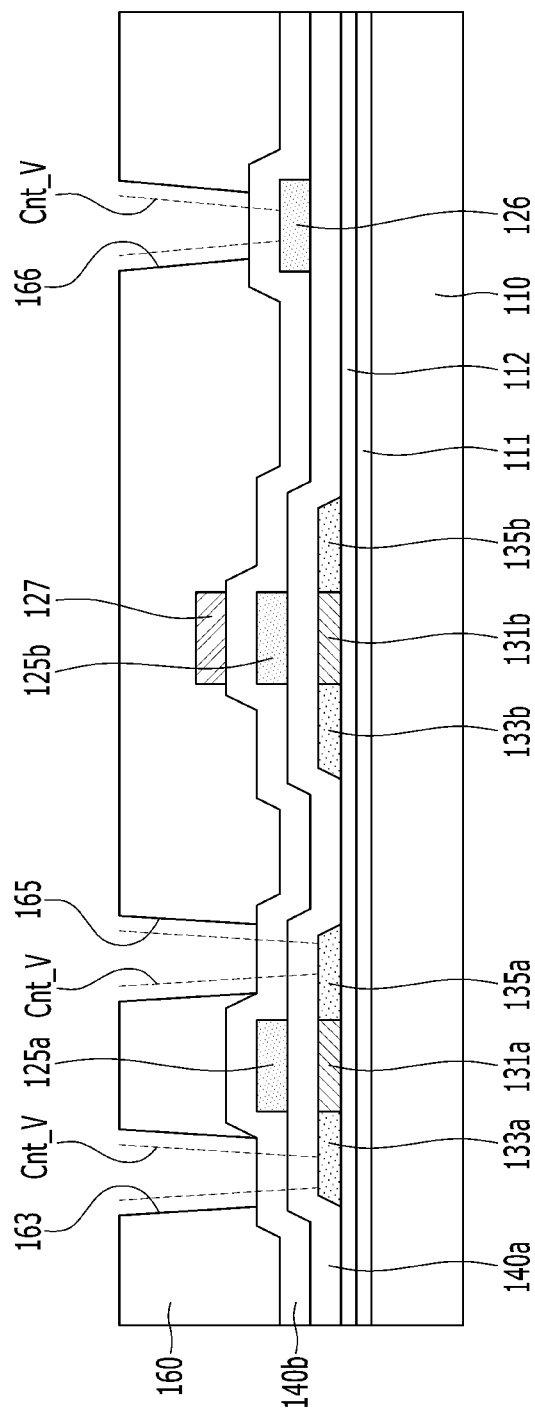

Referring to FIG. 4, a plurality of holes 163, 165, and 166 are formed in the third insulating layer 160 by patterning the third insulating layer 160 with a process such as, for example, photolithography. The hole 163 corresponds to the source electrode 133a, the hole 165 corresponds to the drain electrode 135a, and the hole 166 corresponds to the first conductor 126.

When a target size of contact holes on the source electrode 133a, the drain electrode 135a, and the first conductor 126 is like a virtual contact hole Cnt_V as shown by a dotted line in FIG. 4, a planar size of the holes 163, 165, and 166 of the third insulating layer 160 may be a little larger than a planar size of the virtual contact hole Cnt_V. For this, the third insulating layer 160 may be overdeveloped until the holes 163, 165, and 166 which are a little larger than a planar size of the virtual contact hole Cnt_V are formed in a development process after exposure to light.

Figure 5:
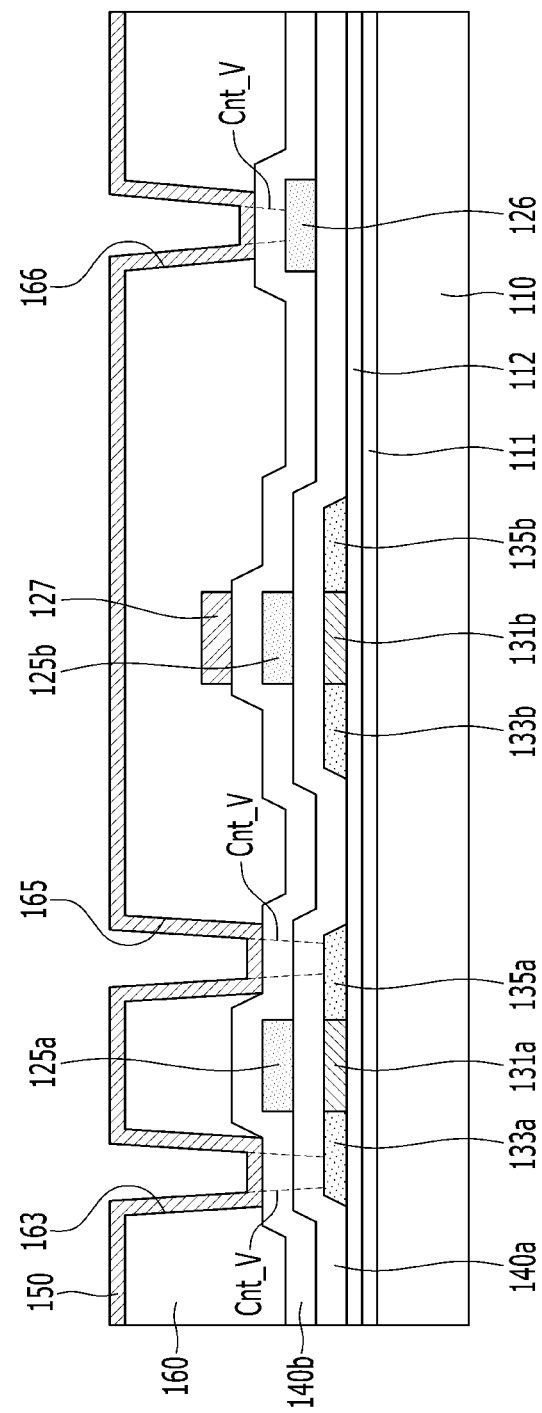

Referring to FIG. 5, an inorganic insulating material, or a conductive material such as a metal, is deposited on the third insulating layer 160 which is patterned using a method such as, for example, sputtering, to form a capping layer 150.

Figure 6:
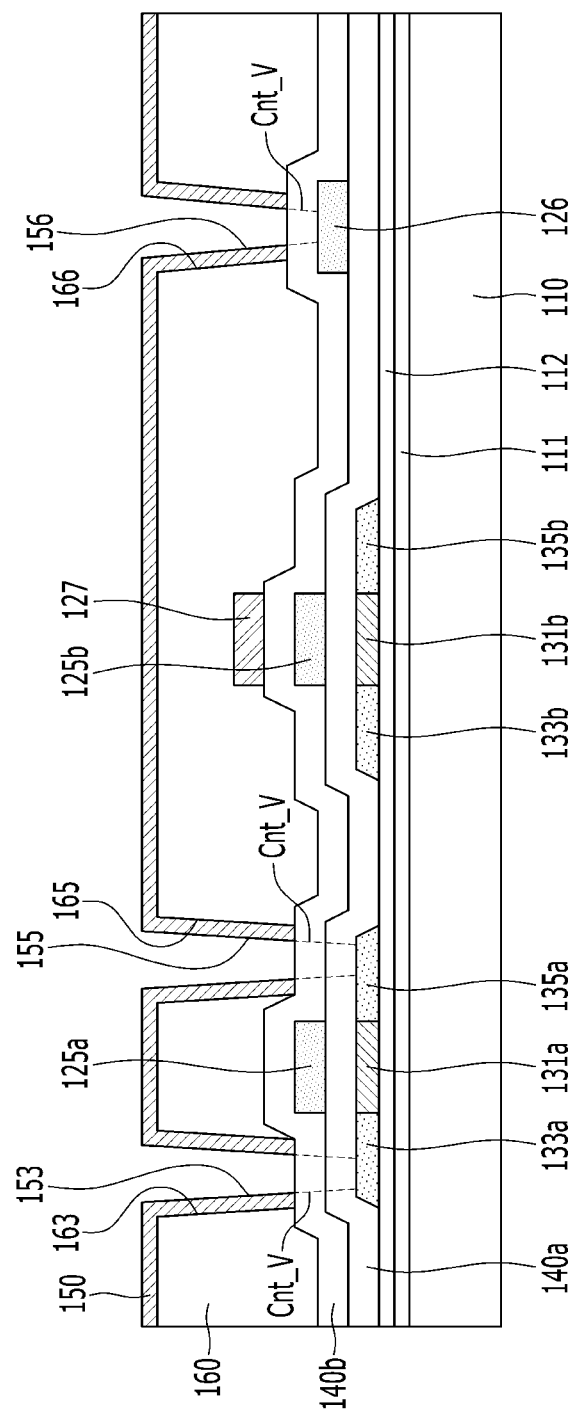

Referring to FIG. 6, the capping layer 150 is patterned using a method such as photolithography to remove a portion of the capping layer 150 which is disposed in the holes 163, 165, and 166 of the third insulating layer 160. The removed portion of the capping layer 150 mostly corresponds to the virtual contact hole Cnt_V, and may be a portion having a surface facing the upper direction in FIG. 5 among the capping layer 150 disposed in the holes 163, 165, and 166. As such, inner portions 153, 155, and 156 which are disposed on the inner lateral surface of the third insulating layer 160 and contact the inner lateral surface in the holes 163, 165, and 166 are formed, and at least a portion of the upper surface of the second insulating layer 140b corresponding to the holes 163, 165, and 166 are exposed.

The photomask used in the process of removing a portion of the capping layer 150 disposed in the holes 163, 165, and 166 of the third insulating layer 160 may be the same photomask used in the process of forming the plurality of holes 163, 165, and 166 by patterning the third insulating layer 160.

Figure 7:
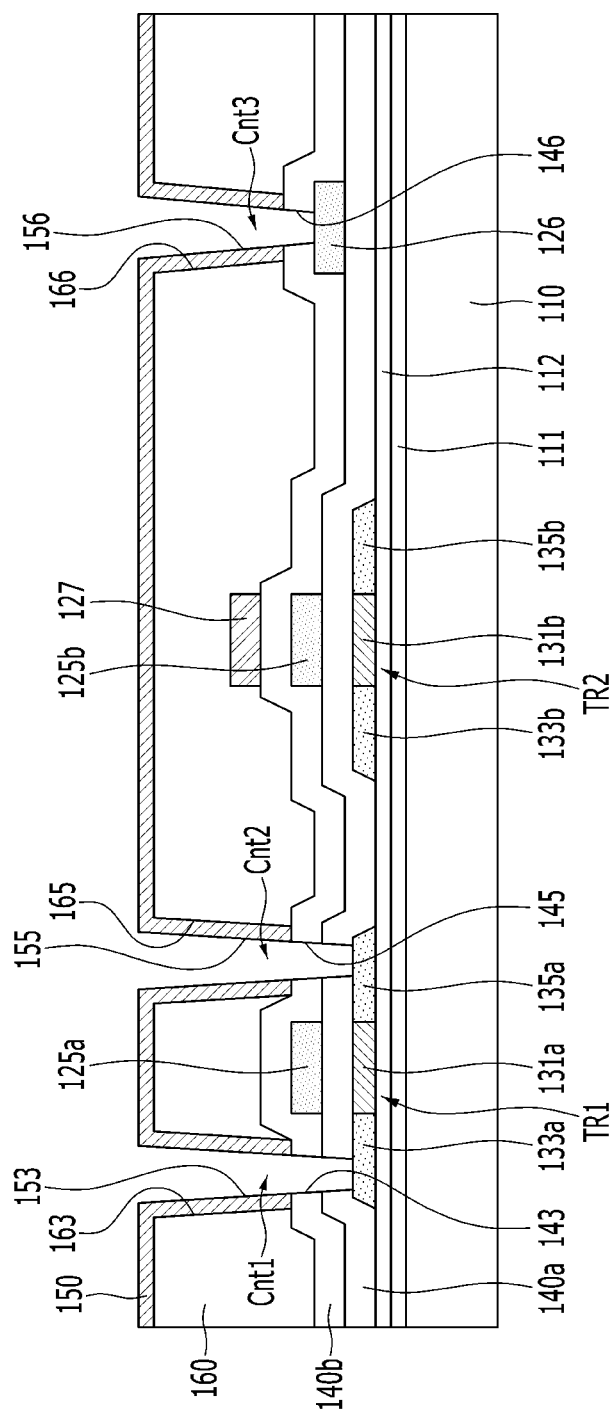

Next, referring to FIG. 7, portions of the first and second insulating layers 140a and 140b which are not covered by the patterned capping layer 150 are removed by using a method such as, for example, dry etching, to form holes 143 and 145 exposing at least one electrode of the TFTs TR1 and TR2, and a hole 146 exposing the first conductor 126 or the second conductor 127. In this process, the patterned capping layer 150 may function as an etching mask for the first and second insulating layers 140a and 140b.

As such, the inner portions 153, 155, and 156 of the capping layer 150 and the holes 143, 145, and 146 of the first and second insulating layers 140a and 140b together form the contact holes Cnt1, Cnt2, and Cnt3 exposing at least one electrode of the TFTs TR1 and TR2.

A difference between an etching ratio for the capping layer 150 and an etching ratio for the first and second insulating layers 140a and 140b of an etching gas used in the etching process of the first and second insulating layers 140a and 140b may be quite large. As such, most of the capping layer 150 may remain during the etching process of the first and second insulating layers 140a and 140b.

Therefore, most of the third insulating layer 160 may be protected from etching due to being covered by the capping layer 150, during the etching process of the first and second insulating layers 140a and 140b for forming the contact holes Cnt1, Cnt2, and Cnt3. Thus, the material included in the third insulating layer 160, such as, for example, the organic material of the third insulating layer 160 when the third insulating layer 160 includes an organic material, may not be removed during the etching process of the first and second insulating layers 140a and 140b. Accordingly, generation of a remaining layer by an organic material on the electrode exposed by the contact holes Cnt1, Cnt2, and Cnt3 may be prevented. Therefore, an increase of contact resistances at the contact holes Cnt1, Cnt2, and Cnt3 may be prevented, and deterioration of characteristics of the TFTs TR1 and TR2 may be prevented.

Since the third insulating layer 160 is not damaged or lost during the etching process of the first and second insulating layers 140a and 140b, a sufficient thickness of the third insulating layer 160 may be maintained. Accordingly, exposure of a conductor which is nearest to the upper surface of the third insulating layer 160, such as the second conductor 127, to the outside may be prevented, such that electrical connection and a short circuit between the second conductor 127 and a conductor to be formed on the third insulating layer 160 in an subsequent process may be prevented.

Since a limit exists in the maximum thickness of the third insulating layer 160 because of limitations of the exposure technology in the photolithographic process of the third insulating layer 160, a short circuit between different conductors which are disposed respectively on and below the third insulating layer 160 may be easily generated when the third insulating layer 160 is removed. However, according to an embodiment, the third insulating layer 160 having such limitation in the maximum thickness is protected by the capping layer 150 and accordingly prevented from being removed, and thus a short circuit between different conductors which are disposed respectively on and below the third insulating layer 160 may be prevented.

An ashing process using a gas such as, for example, oxygen gas may be performed after the etching process of the first and second insulating layers 140a and 140b. Even in such an ashing process, since the capping layer 150 covers most of the third insulating layer 160, loss of the third insulating layer 160 and formation of a remaining layer consisting of a material of the third insulating layer 160 may be prevented.

Next, referring to FIG. 1 and FIG. 2, a conductive material such as a metal is deposited on the capping layer 150 and then patterned to form a plurality of data conductors 173, 175, and 176. As described above, formation of a remaining layer on the electrodes 133a and 135a or the first conductor 126 which the data conductors 173, 175, and 176 contact to be electrically connected thereto by the material of the third insulating layer 160 is prevented by the capping layer 150. Accordingly, an increase of contact resistances between the data conductor 173 or 175 and the electrode 133a or 135a, or between the data conductor 176a and the first conductor 126, may be prevented.

Referring to FIG. 1, during the patterning of the data conductors 173, 175, and 176, the capping layer 150 may not be removed and remains. In such embodiments, the capping layer 150 may include an inorganic insulating material.

Referring to FIG. 2, in the patterning of the data conductors 173, 175, and 176, the capping layer 150 may also be removed and patterned together with the data conductors 173, 175, and 176. In such embodiments, the capping layer 150 may include a conductive material such as a metal.

As such, after all of the layers are formed on the first substrate 110, the first substrate 110 may be detached.

Now, referring to FIG. 8 and FIG. 9, a TFT array panel of a display device according to an embodiment will be described. Like reference numerals designate like elements as in the previously described embodiments, and the same description will be omitted, and differences will be focused on, which applies hereinafter.

Figure 8:
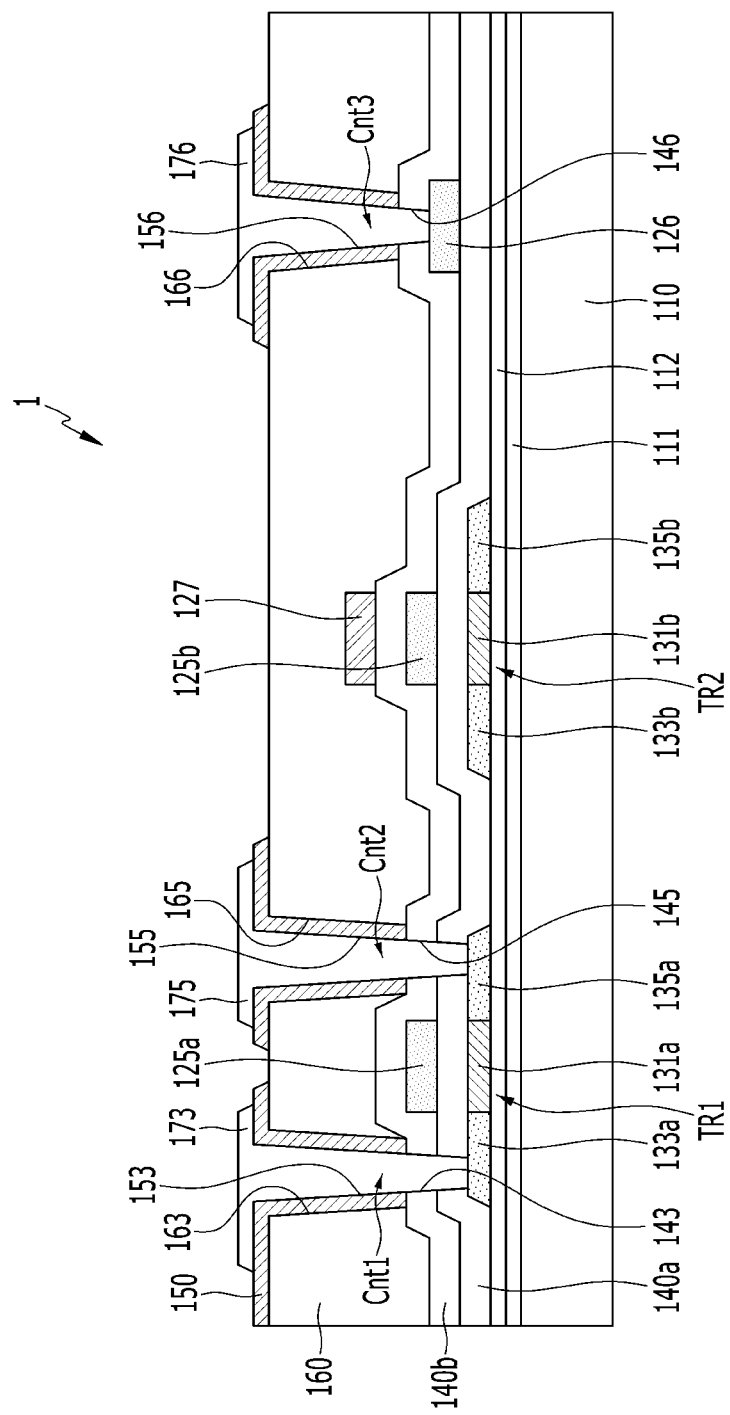
FIG. 8 and FIG. 9 are each a cross-sectional view of a TFT array panel of a display device according to an embodiment.
Figure 9:
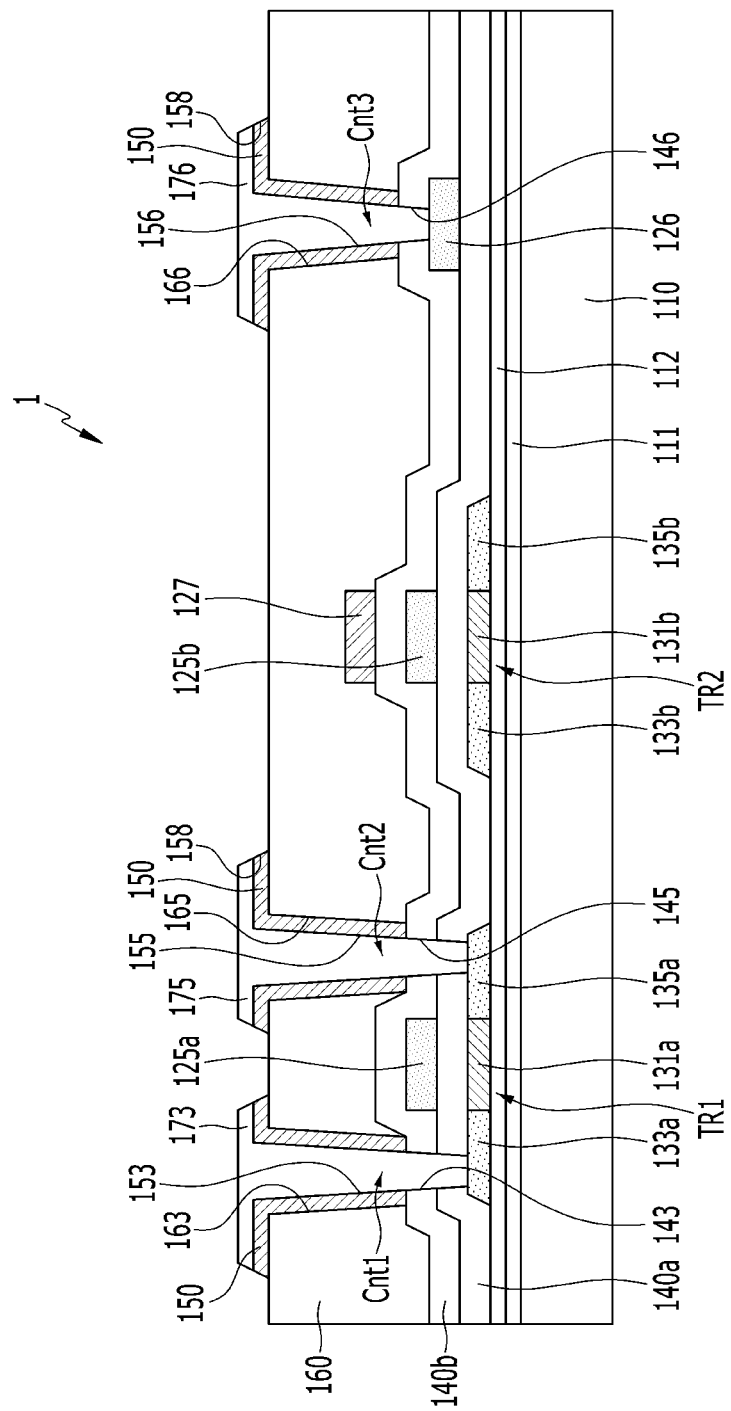

FIG. 8 and FIG. 9 are each a cross-sectional view of a TFT array panel according to an embodiment.

A TFT array panel 1 according to an embodiment shown in FIG. 8 and FIG. 9 is almost the same as the embodiment as shown in FIG. 1 and FIG. 2, but a shape of the capping layer 150 may be different. The capping layer 150 does not exist on an entire area of the upper surface of the third insulating layer 160, but is partly removed to be patterned. Particularly, the capping layer 150 is limitedly formed around each of the contact holes Cnt1, Cnt2, and Cnt3, so that the portions of the capping layer 150 respectively corresponding to different contact holes Cnt1, Cnt2, and Cnt3 may be separated from each other.

Specifically, referring to FIG. 9, the capping layer 150 may include a plurality of cutouts 158 which are disposed on the upper surface of the third insulating layer 160 and disposed between adjacent contact holes Cnt1, Cnt2, and Cnt3.

Referring to FIG. 8, the capping layer 150 may include a surface exposed and not covered by the data conductors 173, 175, and 176. In such embodiments, the material included by the data conductors 173, 175, and 176 may be different from the material included by the capping layer 150. The data conductors 173, 175, and 176 and the capping layer 150 may include materials having different etching ratios from each other.

Referring to FIG. 9, the data conductors 173, 175, and 176 and the capping layer 150 together may expose the third insulating layer 160. In a case that the capping layer 150 has conductivity, the capping layer 150 together with the data conductors 173, 175, and 176 may form an electrode.

Now, a manufacturing method for a TFT array panel according to an embodiment will be described referring to FIG. 10 to FIG. 15 with FIG. 8 and FIG. 9.

FIG. 10 to FIG. 15 are each cross-sectional views sequentially showing processes of a manufacturing method of a TFT array panel shown in FIG. 8 or FIG. 9.

Since a manufacturing method for a TFT array panel according to an embodiment is mostly the same as the manufacturing method according to the previously described embodiment, mainly differences will be described here.

Figure 10:
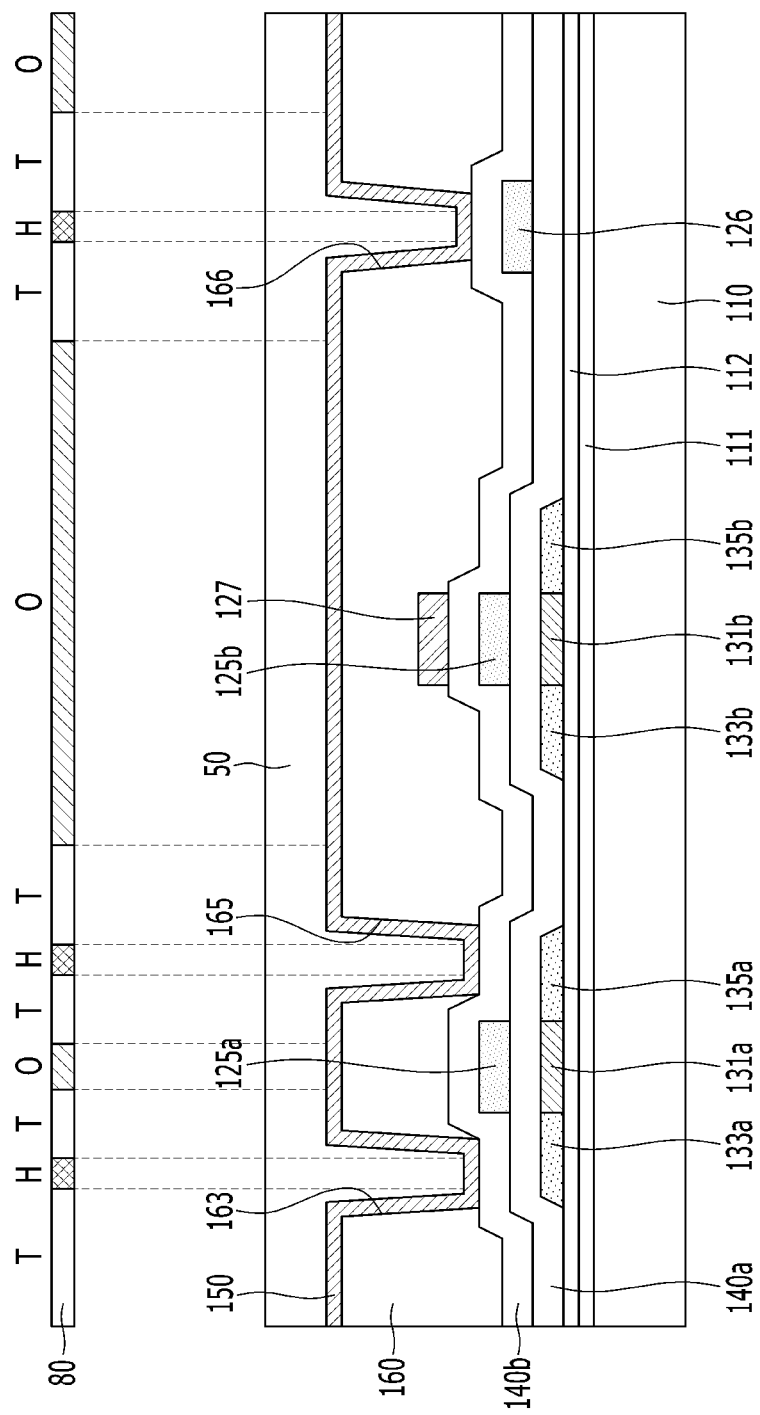
FIG. 10 to FIG. 15 are each a cross-sectional view sequentially showing processes of a manufacturing method of a TFT array panel of a display device shown in FIG. 8 or FIG. 9, FIG. 16 and FIG. 17 are each a cross-sectional view of a TFT array panel of a display device according to an embodiment.

First, referring to FIG. 10, after performing the steps shown in FIG. 3 to FIG. 5 as previously described, a photosensitive layer 50 is formed by depositing a photosensitive material such as a photoresist on the capping layer 150. Then, a photomask 80 is disposed over the photosensitive layer 50, and then the photosensitive layer 50 is exposed to light via the photomask 80.

The photomask 80 may include at least three regions having different transmittances from each other. For example, in a case that the photosensitive layer 50 has negative photosensitivity, in which a portion not exposed to light is removed, a transparent region T of the photomask 80 corresponds to a portion of the photosensitive layer 50 which should be the thickest, a semi-transparent region H of the photomask 80 corresponds to a portion of the photosensitive layer 50 which should be thinner than the thickest portion, and an opaque portion O of the photomask 80 corresponds to a portion of the photosensitive layer 50 which should be removed. The semi-transparent region H of the photomask 80 corresponds to the holes 163, 165, and 166 of the third insulating layer 160. Transmittances of the photomask 80 sequentially decrease in an order of the transparent region T, the semi-transparent region H, and the opaque portion O. The semi-transparent region H is a portion through which only a portion of light can transmit, and may have slits, patterns such as for example a lattice, or a semi-transparent film for controlling a transmittance degree of light.

In a case that the photosensitive material has positive photosensitivity, the transmittances of the photomask 80 are reversed with respect to the case of the negative photosensitivity.

Figure 11:
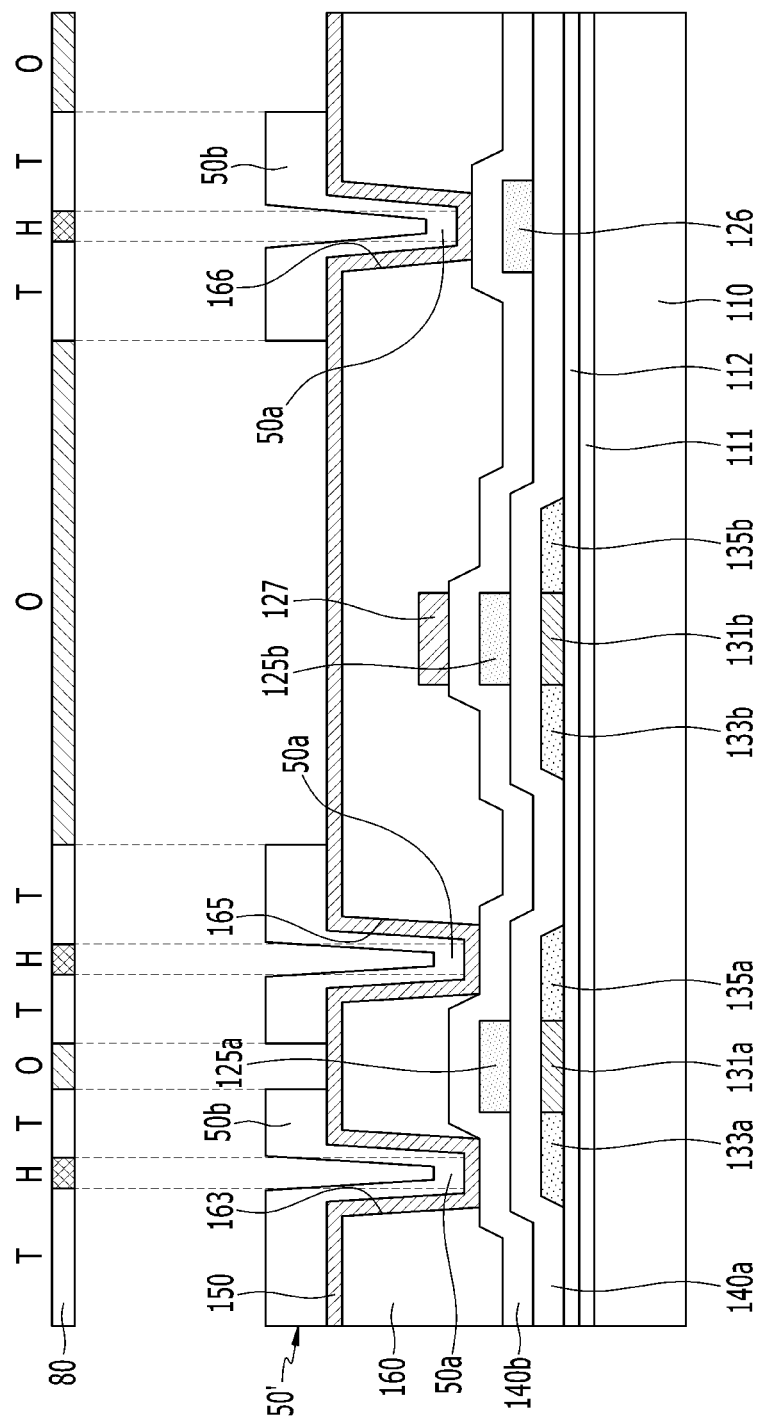

Next, referring to FIG. 11, the photosensitive layer 50 exposed to light via the photomask 80 is developed, a portion of the photosensitive layer 50 corresponding to the opaque portion O of the photomask 80 is removed, and portions of the photosensitive layer 50 corresponding to the transparent region T and the semi-transparent region H remain to form a photosensitive layer pattern 50'. The photosensitive layer pattern 50' includes a first portion 50a corresponding to the semi-transparent region H and a second portion 50b corresponding to the transparent region T, and a thickness of the first portion 50a in a sectional direction is less than a thickness of the second portion 50b in the sectional direction. The first portion 50a is disposed corresponding to each of the holes 163, 165, and 166 of the third insulating layer 160. A planar width of the first portion 50a may be less than a planar width of each of the holes 163, 165, and 166 of the third insulating layer 160.

Figure 12:
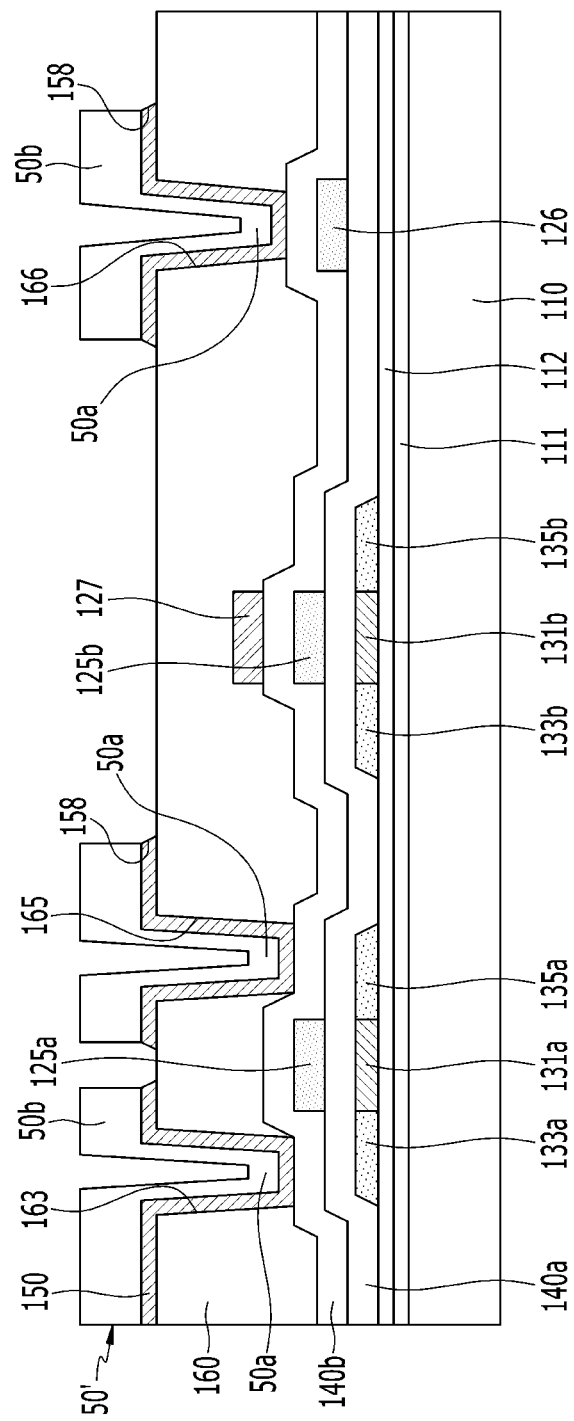

Referring to FIG. 12, the capping layer 150 is removed by a method such as etching using the photosensitive layer pattern 50' as an etching mask to form a plurality of cutouts 158. An upper surface of the third insulating layer 160 is exposed by the cutouts 158 of the capping layer 150. The cutouts 158 may include a portion which is disposed between adjacent holes 163, 165, and 166 of the third insulating layer 160.

Figure 13:
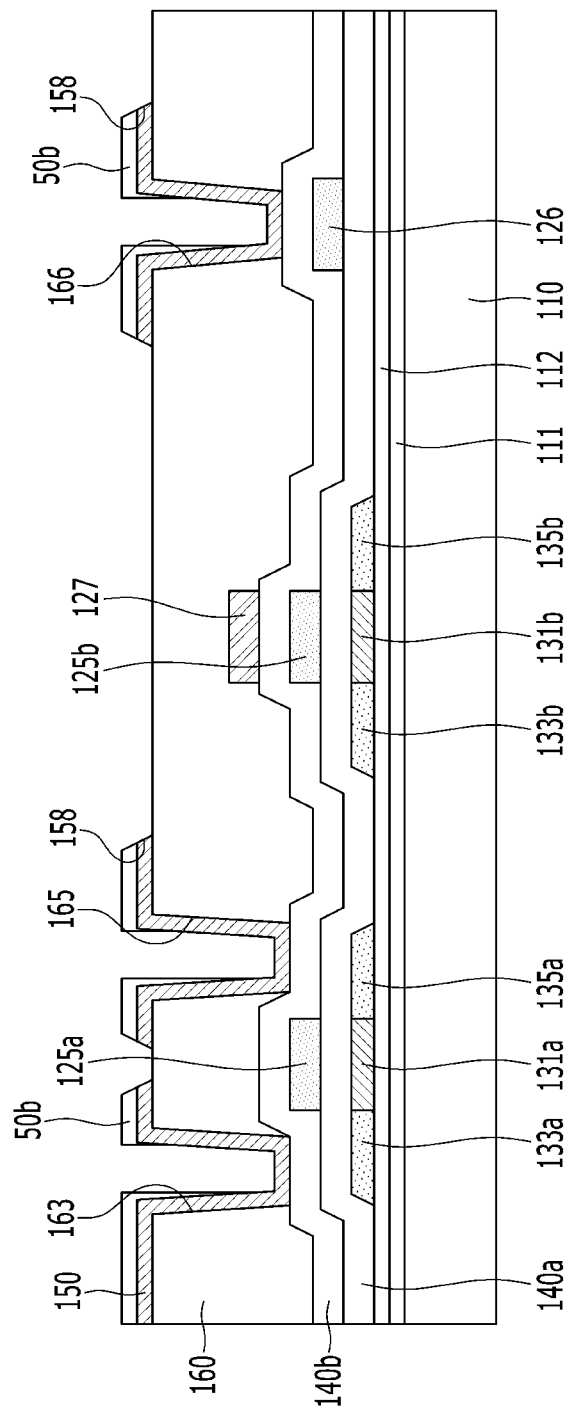

Next, referring to FIG. 12 and FIG. 13, the first portion 50a of the photosensitive layer pattern 50' is removed to leave the second portion 50b. A thickness of the second portion 50b in the sectional direction may become thinner. By removal of the first portion 50a, a portion of the capping layer 150 disposed in the holes 163, 165, and 166 of the third insulating layer 160 is exposed. A planar size of the exposed portion of the capping layer 150 in the holes 163, 165, and 166 of the third insulating layer 160 may be less than a planar size of each of the holes 163, 165, and 166 of the third insulating layer 160. Among the portion of the capping layer 150 disposed in the holes 163, 165, and 166, a portion nearest to the first substrate 110 or a portion having a surface substantially parallel to the surface of the first substrate 110 may be exposed.

Figure 14:
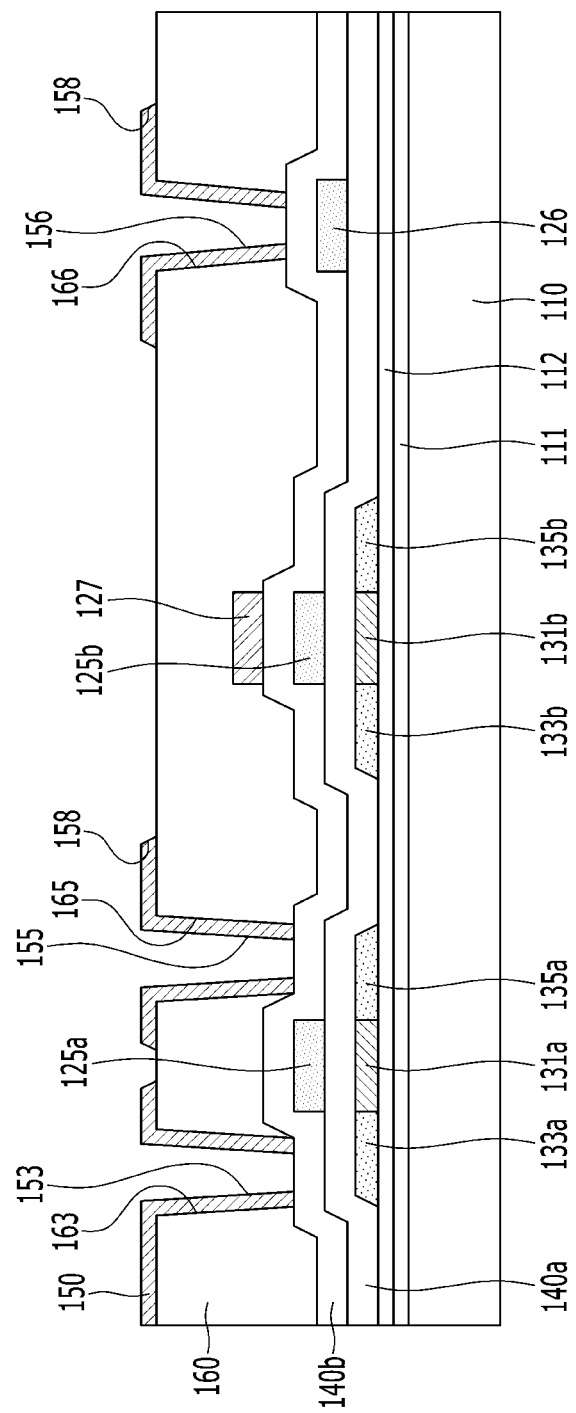

Next, referring to FIG. 14, the exposed capping layer 150 is removed using the second portion 50b as an etching mask. Accordingly, a portion of the capping layer 150 disposed in the holes 163, 165, and 166 of the third insulating layer 160 is removed so that the second insulating layer 140b is exposed, and inner portions 153, 155, and 156 which are disposed on and contact the inner lateral surface of the third insulating layer 160 disposed in the holes 163, 165, and 166 are formed.

The exposed second insulating layer 140b is disposed in the holes 163, 165, and 166 of the third insulating layer 160 and may have a smaller size than a planar size of the corresponding holes 163, 165, and 166 of the third insulating layer 160, but is not limited thereto.

Figure 15:
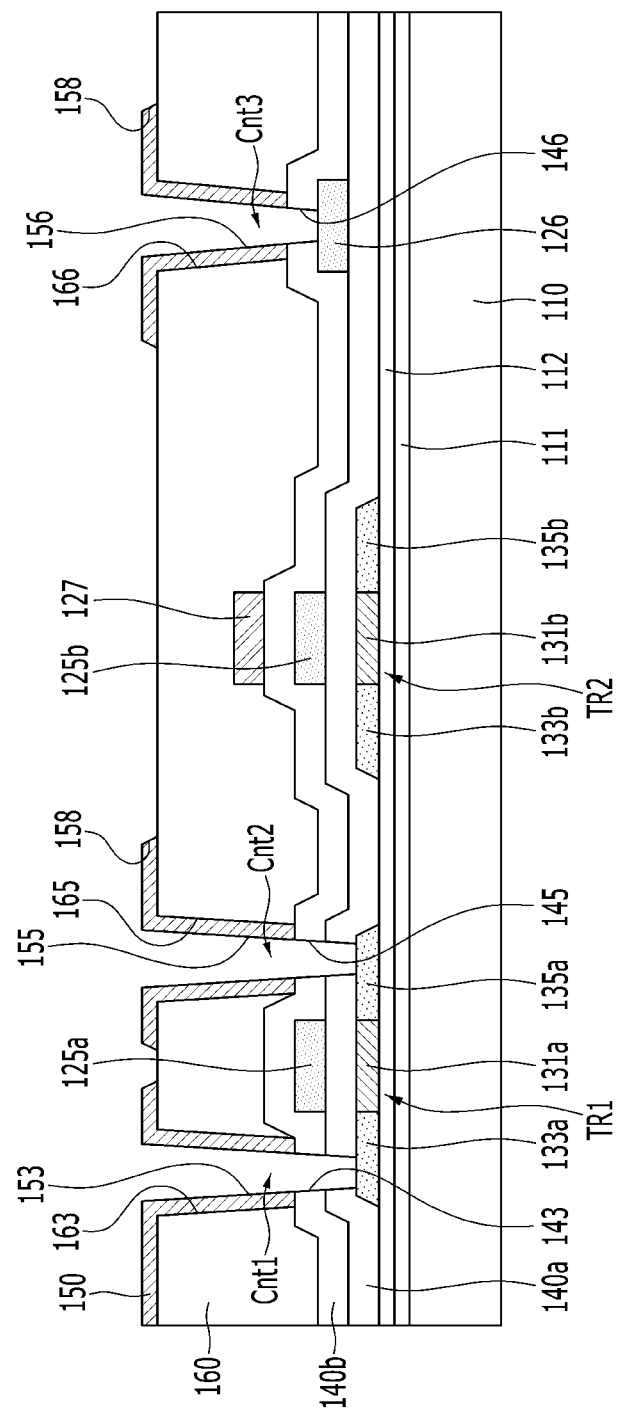

Referring to FIG. 7, portions of the first and second insulating layers 140a and 140b which are not covered by the patterned capping layer 150 are removed by using a method such as etching, to form holes 143 and 145 exposing at least one electrode of the TFTs TR1 and TR2, and a hole 146 exposing the first conductor 126 or the second conductor 127. FIG. 15 shows an example in which the hole 146 exposes the first conductor 126.

The inner portions 153, 155, and 156 of the capping layer 150 and the holes 143, 145, and 146 of the first and second insulating layers 140a and 140b together form the contact holes Cnt1, Cnt2, and Cnt3 exposing at least one electrode of the TFTs TR1 and TR2 and the first conductor 126.

As such, the third insulating layer 160 may be protected from etching because the third insulating layer 160 disposed around the portion where the first and second insulating layers 140a and 140b are etched is covered by the capping layer 150, during the etching process of the first and second insulating layers 140a and 140b for forming the contact holes Cnt1, Cnt2, and Cnt3.

An ashing process using a gas such as, for example, oxygen gas may be performed after the etching process of the first and second insulating layers 140a and 140b. Even in such an ashing process, since the capping layer 150 covers most of the third insulating layer 160, loss of the third insulating layer 160 and formation of a remaining layer including a material of the third insulating layer 160 may be prevented.

Next, referring to FIG. 8 and FIG. 9, a conductive material such as a metal is deposited on the capping layer 150 and then patterned to form a plurality of data conductors 173, 175, and 176. Referring to FIG. 8, during the pattering of the data conductors 173, 175, and 176, the capping layer 150 which is not covered by the data conductors 173, 175, and 176 and is exposed may not be removed and remains. In this case, the capping layer 150 may include an inorganic insulating material. Referring to FIG. 9, in the patterning of the data conductors 173, 175, and 176, the capping layer 150 may also be removed. In this case, the capping layer 150 may include a conductive material such as a metal.

Now, referring to FIG. 16 and FIG. 17, a TFT array panel of a display device according to an embodiment will be described.

Figure 16:
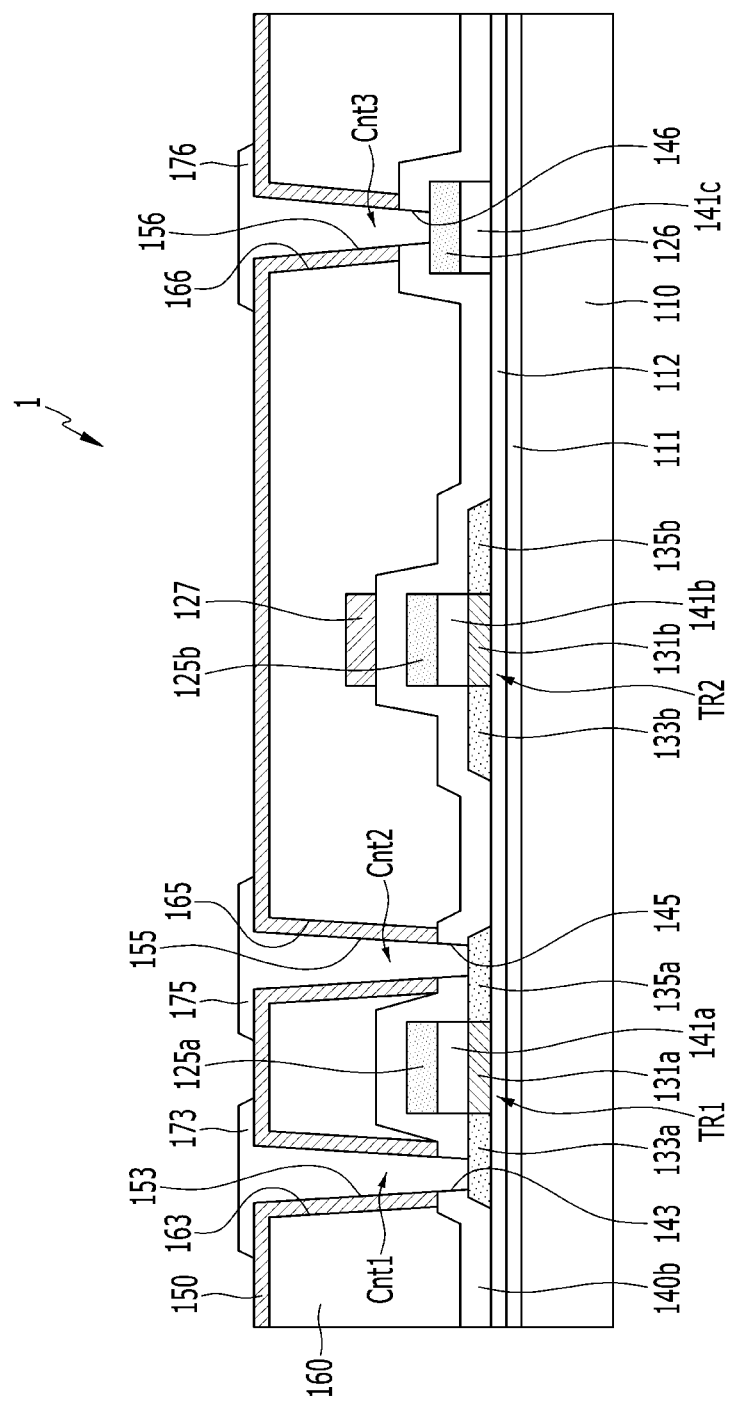
Figure 17:
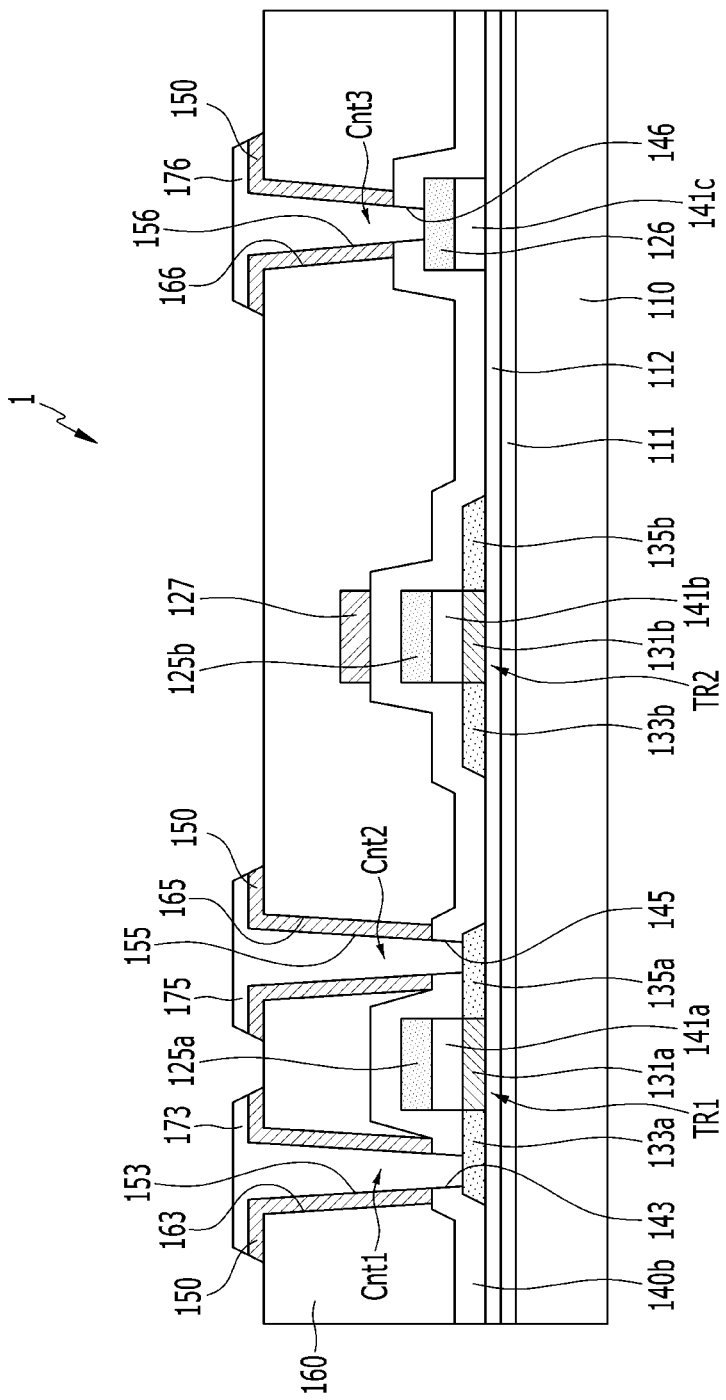

FIG. 16 and FIG. 17 are each a cross-sectional view of a TFT array panel according to an embodiment.

A TFT array panel 1 according to an embodiment shown in FIG. 16 and FIG. 17 is almost the same as the embodiment as shown in FIG. 1 and FIG. 2, but the structure of the TFTs TR1 and TR2 may be different.

Insulators 141a and 141b may be disposed between the semiconductors 131a and 131b of the TFTs TR1 and TR2 and the gate electrodes 125a and 125b, an insulator 141c is disposed between the first conductor 126 and the buffer layer 112, and adjacent insulators 141a, 141b, and 141c in a plan view are separated from each other.

A planar shape of each of the insulators 141a, 141b, and 141c may be the same as a planar shape of the respectively overlapping gate electrodes 125a and 125b or the first conductor 126. That is, an edge of the upper surface of the insulators 141a, 141b, and 141c may be substantially parallel to an edge of the lower surface of the gate electrodes 125a and 125b or the first conductor 126. That two edges are substantially parallel to each other means that the two edges are aligned with each other or substantially parallel to each other at a predetermined distance even if not being aligned with each other.

According some embodiments, a planar shape of the semiconductors 131a and 131b may be substantially the same as a planar shape of the insulators 141a and 141b. An edge of the upper surface of the semiconductors 131a and 131b may be substantially parallel to an edge of the lower surface of the insulators 141a and 141b disposed directly on the semiconductors 131a and 131b.

The insulators 141a and 141b cover most of the respective semiconductors 131a and 131b.

According to an embodiment shown in FIG. 16, the capping layer 150 covering the upper surface of the third insulating layer 160 may not be removed and remains, like the embodiment shown in FIG. 1.

According to an embodiment shown in FIG. 17, the capping layer 150 and the data conductors 173, 175, and 176 together may expose an upper surface of the third insulating layer 160, like the embodiment shown in FIG. 2. In a case that the capping layer 150 has conductivity, the capping layer 150 may form an electrode together with the data conductors 173, 175, and 176.

Now, referring to FIG. 18 to FIG. 23 as well as FIG. 16 and FIG. 17, a manufacturing method of a TFT array panel of a display device according to an embodiment.

FIG. 18 to FIG. 23 are each cross-sectional views sequentially showing processes of a manufacturing method of a TFT array panel shown in FIG. 16 or FIG. 17.

Figure 18:
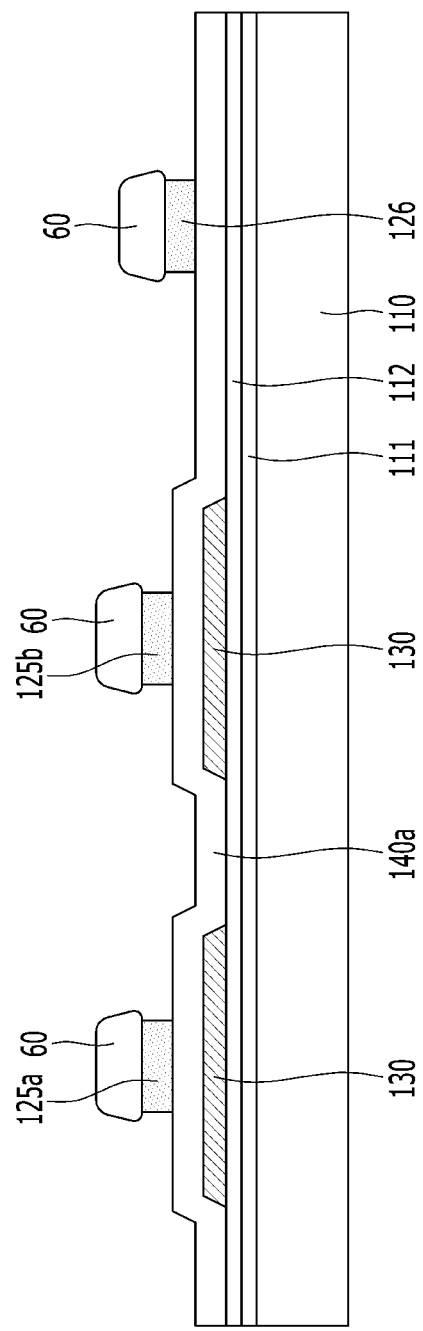
FIG. 18 to FIG. 23 are each a cross-sectional view sequentially showing processes of a manufacturing method of a TFT array panel of a display device shown in FIG. 16 or FIG. 17, FIG. 24 and FIG. 25 are each a cross-sectional view of a TFT array panel of a display device according to an embodiment.

First, referring to FIG. 18, like the descriptions related with FIG. 3 to FIG. 7, the second substrate 111 and the buffer layer 112 are sequentially formed on the first substrate 110, and then a semiconductor material layer is deposited on the buffer layer 112 and patterned to form a semiconductor layer 130. The semiconductor material layer may include an oxide semiconductor material.

Next, the first insulating layer 140a is formed on the first substrate 110 with the semiconductor layer 130 by depositing an inorganic insulating material such as, for example, silicon oxide ($SiO_x$), silicon nitride ($SiN_x$), or silicon oxynitride ($SiO_xN_y$).

A conductive material such as a metal is then deposited on the first insulating layer 140a to form a conductive layer, a photosensitive layer such as a photoresist is formed on the conductive layer, and a photosensitive layer pattern 60 is formed by an exposure process to the photosensitive layer using a photomask. Using the photosensitive layer pattern 60 as a mask, the conductive layer exposed by the photosensitive layer pattern 60 is removed with a method such as etching, to form gate electrodes 125a and 125b and the first conductor 126.

Figure 19:
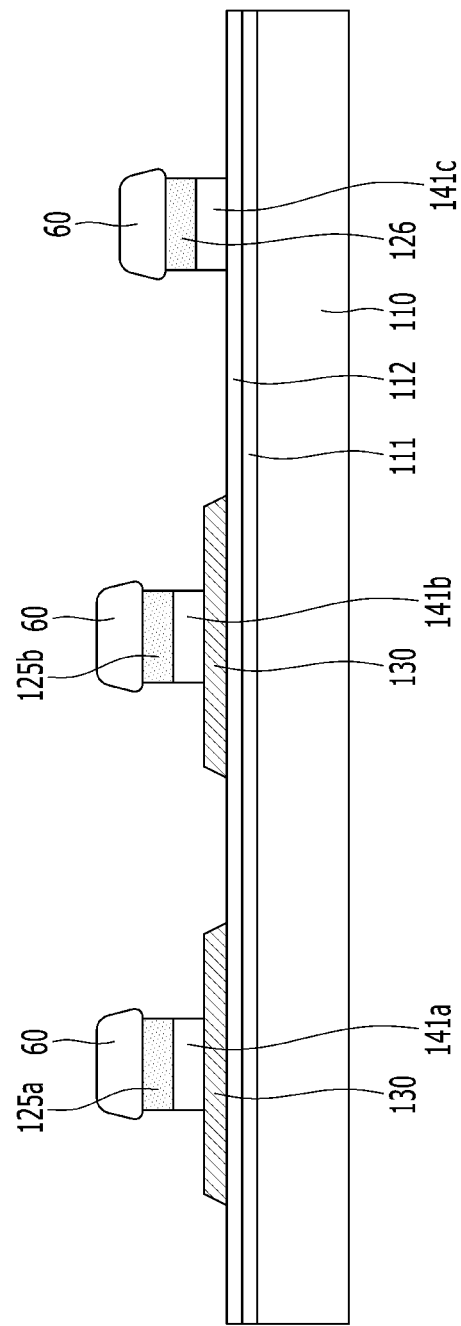
Figure 20:
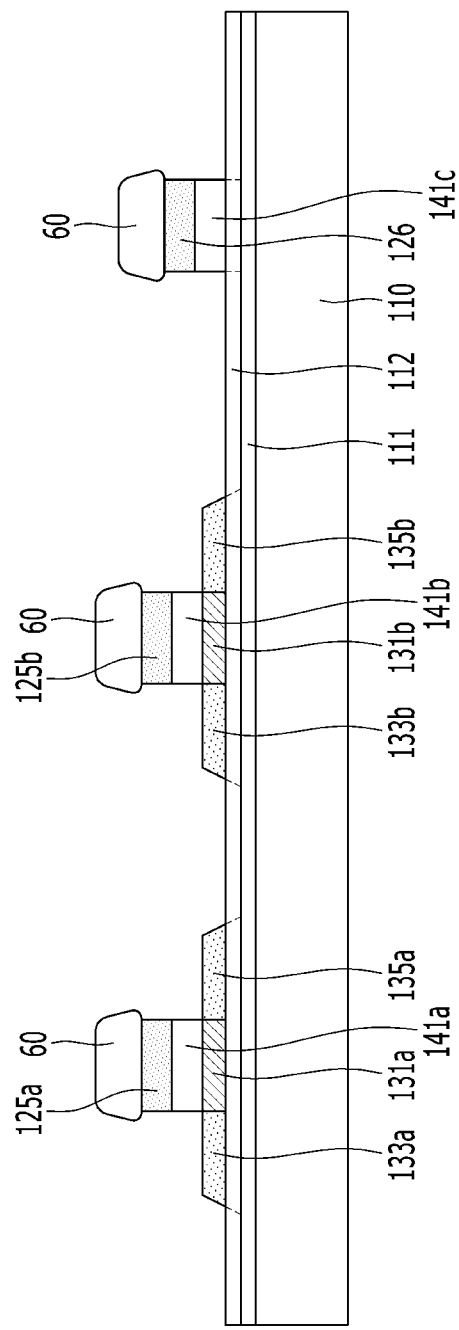

Referring to FIG. 19 and FIG. 20, using the photosensitive layer pattern 60 as a mask, the first insulating layer 140a is then removed with a method such as etching, to form a plurality of insulators 141a, 141b, and 141c. In this case, the first insulating layer 140a may be etched using a dry etching method. Referring to FIG. 20, during the process of forming the plurality of insulators 141a, 141b, and 141c, the semiconductor layer 130 covered by the insulators 141a, 141b, and 141c remains as the semiconductors 131a and 131b owing to a doping effect of an element included in an etching gas, and the rest of the semiconductor layer 130 changes to have conductivity so that source electrodes 133a and 133b and drain electrodes 135a and 135b may be formed.

During such a patterning process of the insulators 141a, 141b, and 141c or after the formation process of the insulators 141a, 141b, and 141c, the buffer layer 112 is etched using the semiconductor layer 130 as a mask, so that the buffer layer 112 may be patterned as shown by the dotted line in the buffer layer in FIG. 20.

The semiconductor layer 130 not covered by the insulators 141a, 141b, and 141c and exposed may be additionally treated to form the source electrodes 133a and 133b, and the drain electrodes 135a and 135b. The treatment method may include a heat treatment in an atmosphere for reduction, or a plasma treatment using gas plasma such as hydrogen gas ($H_2$).

Then, the photosensitive layer pattern 60 is removed. The removal of the photosensitive layer pattern 60 may be performed before the treatment for the semiconductor layer 130.

Figure 21:
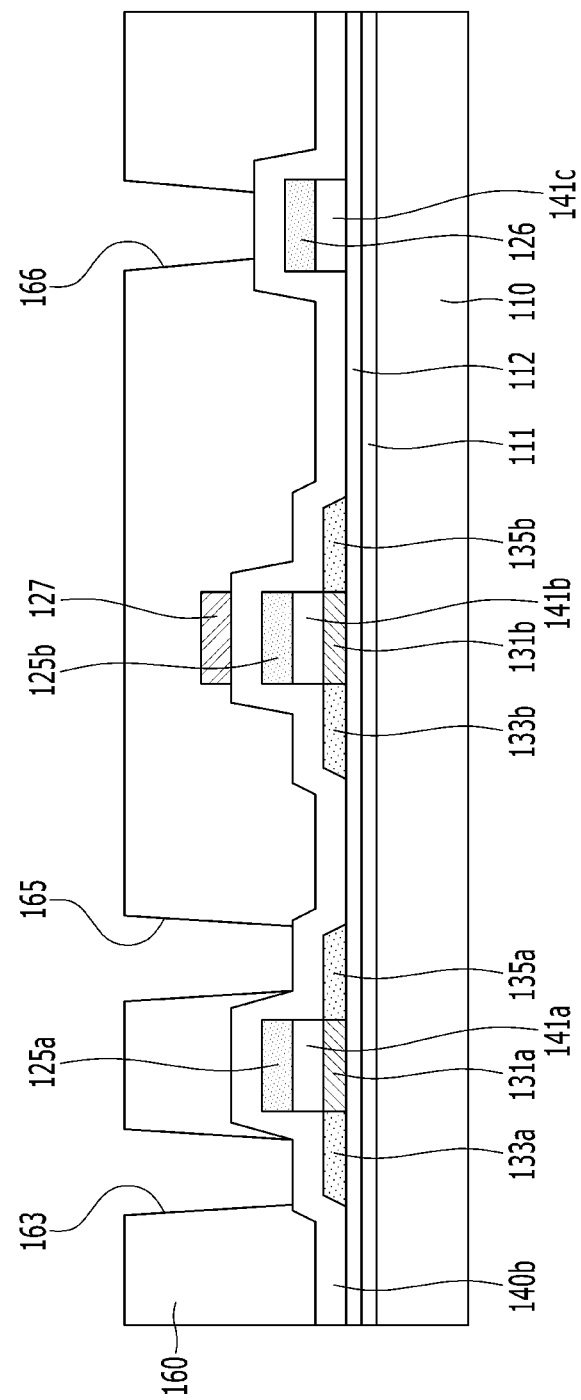

Next, referring to FIG. 21, the second insulating layer 140b is formed on the first substrate 110 on which the gate electrodes 125a and 125b and the first conductor 126 are formed, and then a conductive material such as a metal is deposited on the second insulating layer 140b to form a conductive layer, and the conductive layer is patterned to form the second conductor 127. An insulating material is then deposited on the second insulating layer 140b and the second conductor 127 to from the third insulating layer 160, and the third insulating layer 160 is patterned to form a plurality of holes 163, 165, and 166.

Figure 22:
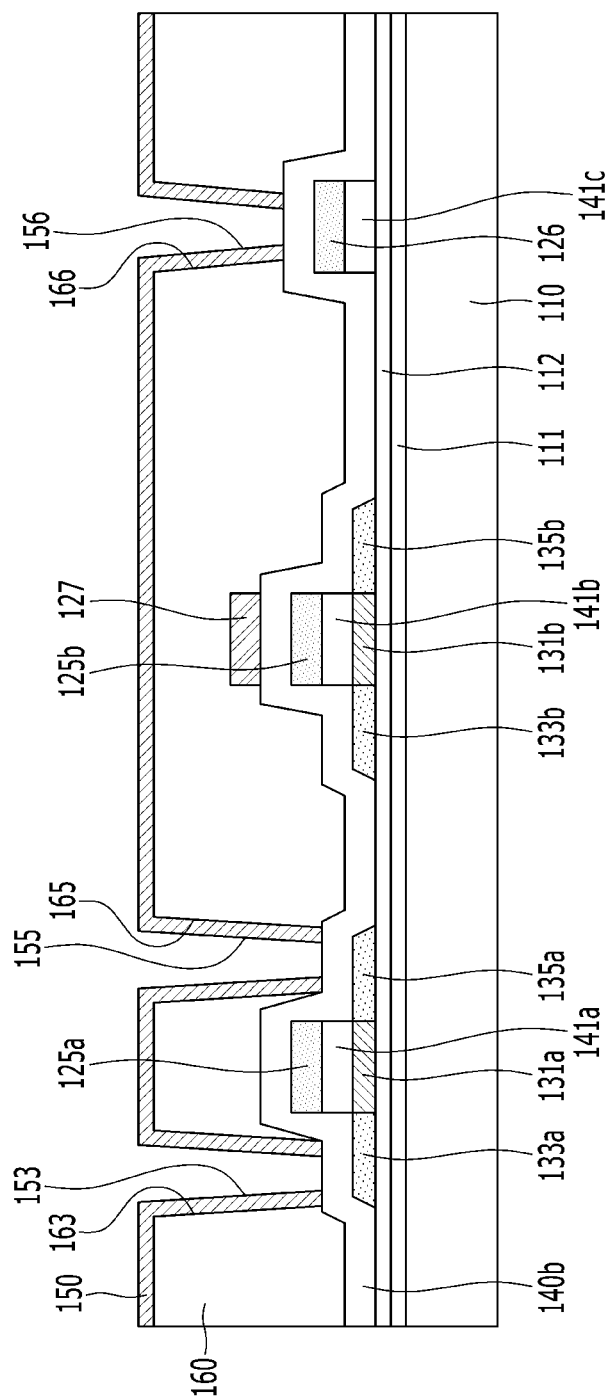

Referring to FIG. 22, the capping layer 150 is formed on the patterned third insulating layer 160, and then the capping layer 150 is patterned to remove a portion disposed in the holes 163, 165, and 166 of the third insulating layer 160. In this process, among the capping layer 150, the inner portions 153, 155, and 156 disposed on the inner lateral surface forming the holes 163, 165, and 166 of the third insulating layer 160 may remain. A portion of the second insulating layer 140b disposed in the holes 163, 165, and 166 of the third insulating layer 160 is exposed by the removed capping layer 150.

Figure 23:
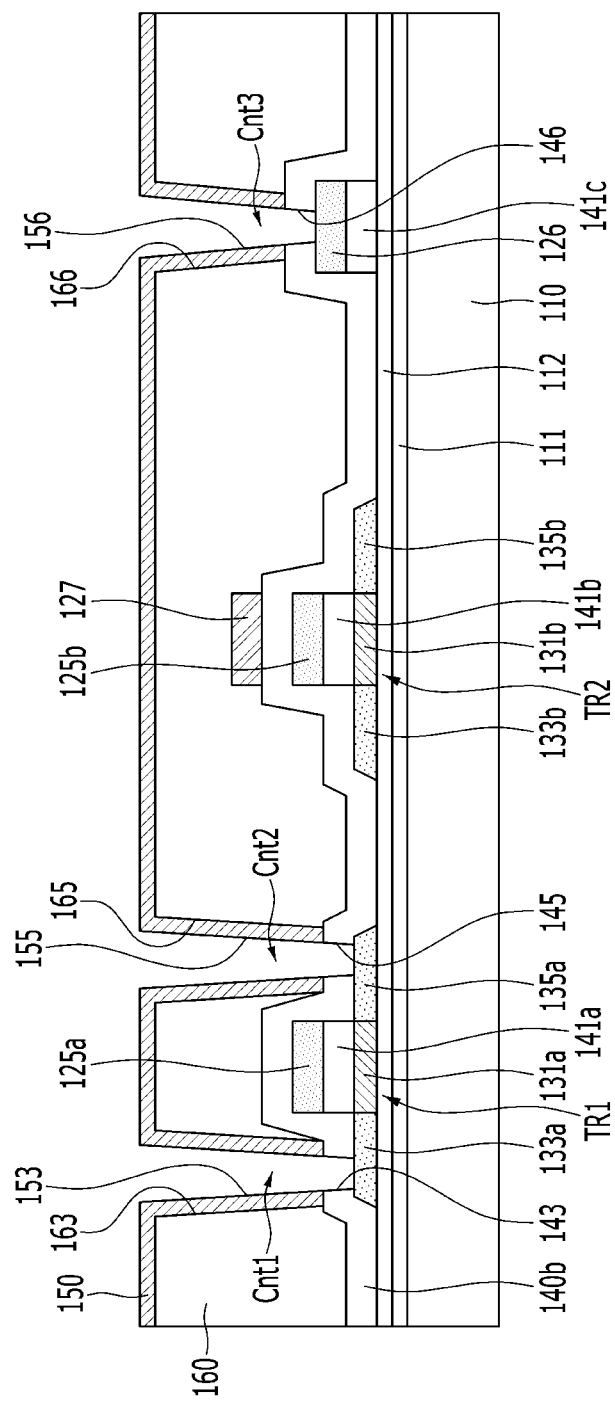

Referring to FIG. 23, the first and second insulating layers 140a and 140b not covered by the capping layer 150 and exposed are etched to form holes 143 and 145 exposing at least one electrode of the TFTs TR1 and TR2, and a hole 146 exposing the first conductor 126 or the second conductor 127. Since the following processes are the same as in the previously described embodiment, detailed descriptions for the following processes are omitted.

Now, referring to FIG. 24 and FIG. 25, a TFT array panel of a display device according to an embodiment will be described.

Figure 24:
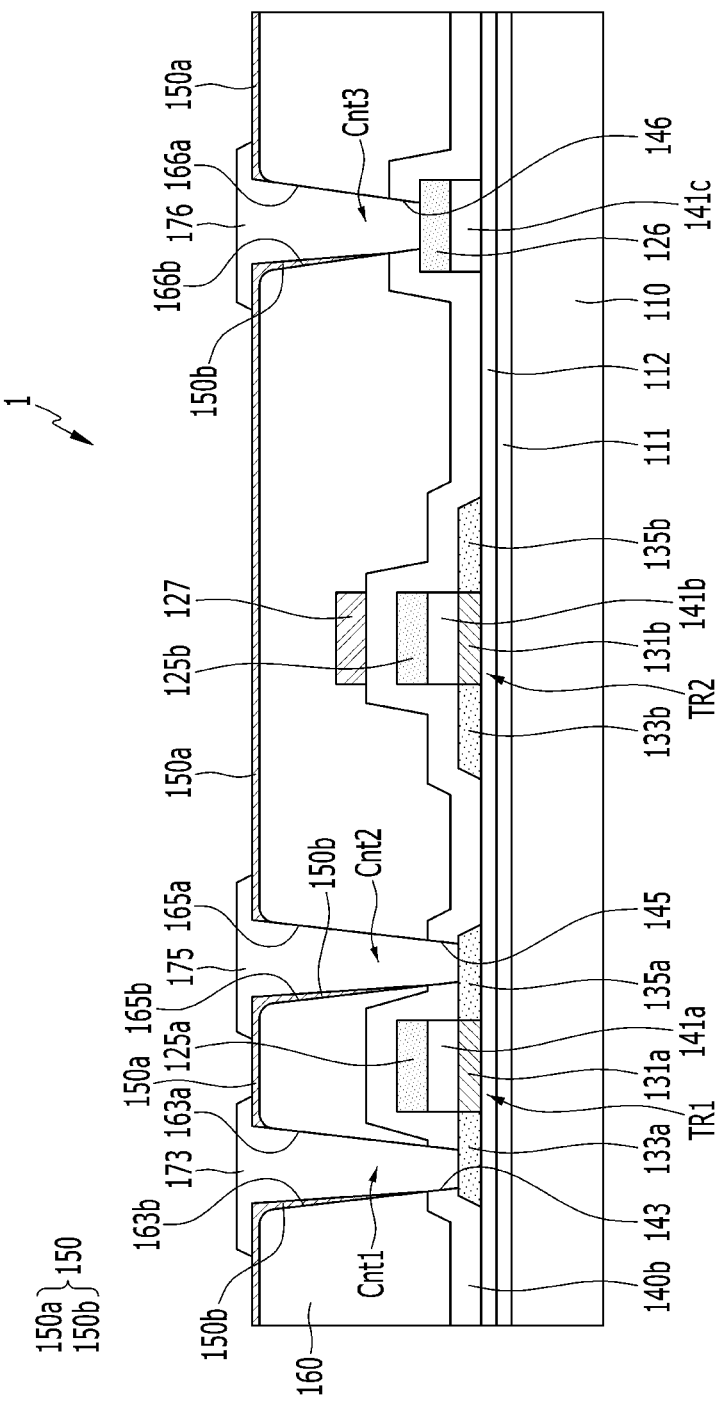
Figure 25:
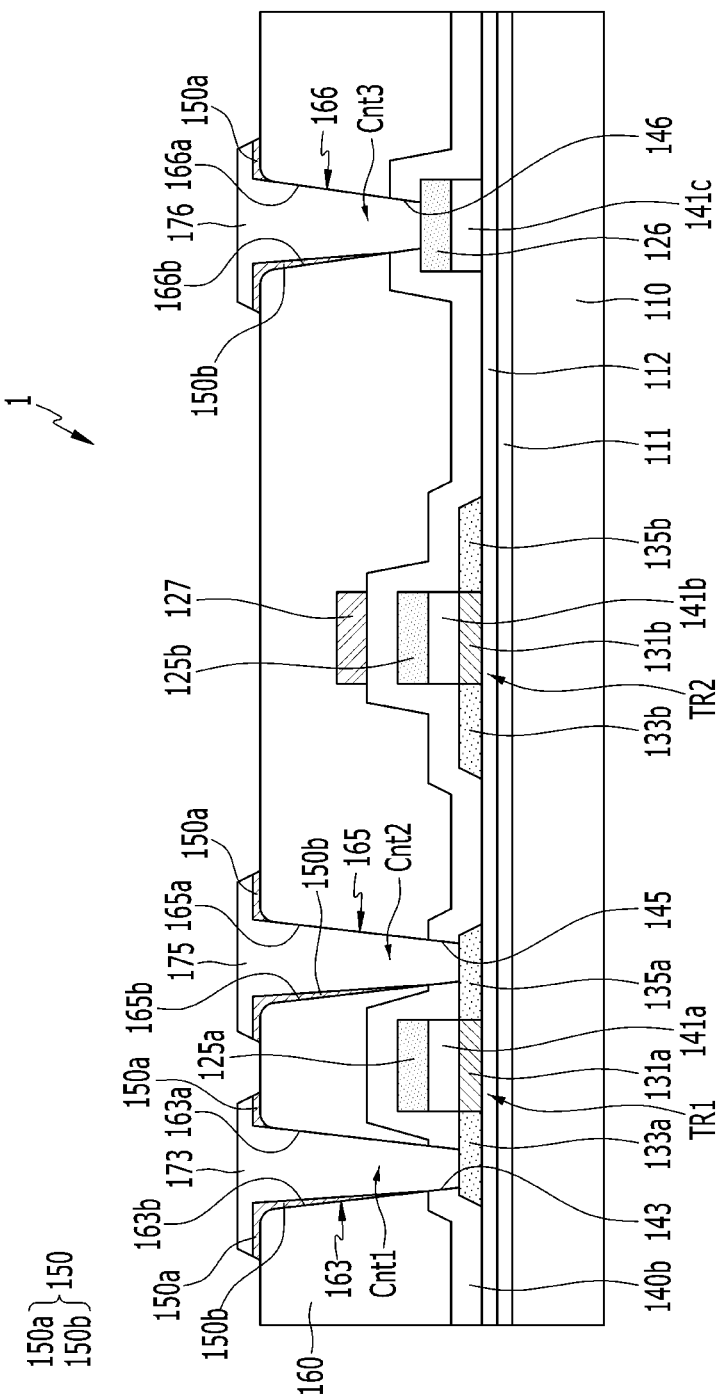

FIG. 24 and FIG. 25 are each a cross-sectional view of a TFT array panel according to an embodiment.

A TFT array panel 1 according to an embodiment shown in FIG. 24 and FIG. 25 is almost the same as the previously described embodiments, but the capping layer 150 may be different. The structure of the TFTs TR1 and TR2 as shown in FIG. 24 and FIG. 25 are depicted to be the same as the structure of the TFTs TR1 and TR2 in the embodiment shown in FIG. 16 and FIG. 17, but is not limited thereto, as the structure of the TFTs TR1 and TR2 may be varied.

The capping layer 150 according to the present embodiment includes an inner portion 150b disposed on and contacting the inner lateral surface of the holes 163, 165, and 166 of the third insulating layer 160. The inner portion 150b is disposed only on the inner lateral surface forming the holes 163, 165, and 166 of the third insulating layer 160, and substantially is not disposed on the inner lateral surface forming the holes 143, 145, and 146 of the first and second insulating layers 140a and 140b.

The capping layer 150 may further include an upper portion 150a disposed on the upper surface of the third insulating layer 160. The upper portion 150a is connected with an adjacent inner portion 150b.

A deposited thickness of the inner portion 150b in the holes 163, 165, and 166 of the third insulating layer 160 may not be uniform but varies according to positions thereof.

Specifically, the deposited thickness of the inner portion 150b in the holes 163, 165, and 166 of the third insulating layer 160 may be different according to a planar position, and may be asymmetrical in a plan view. For example, the inner portion 150b of the capping layer 150 may be formed only on a portion of the inner lateral surface of each of the holes 163, 165, and 166 of the third insulating layer 160. When the inner lateral surfaces of each of the holes 163, 165, and 166 of the third insulating layer 160 have first surfaces 163a, 165a, and 166a and second surfaces 163b, 165b, and 166b which face each other, the capping layer 150 is not formed on the first surfaces 163a, 165a, and 166a, but the inner portion 150b of the capping layer 150 is formed on the second surfaces 163b, 165b, and 166b. The deposited thickness means a thickness in a direction perpendicular to the surface of the third insulating layer 160 on which the capping layer 150 is formed.

The deposited thickness of the inner portion 150b of the capping layer 150 may be different depending on the depth in the contact holes Cnt1, Cnt2, and Cnt3. As shown in FIG. 24 and FIG. 25, the deposited thickness of the inner portion 150b of the capping layer 150 may become thinner closer to the first substrate 110.

The deposited thickness of the upper portion 150a may be greater or equal to the maximum deposited thickness of the inner portion 150b.

As such, according to the present embodiment, the inner portion 150b of the capping layer 150 disposed in the contact holes Cnt1, Cnt2, and Cnt3 is not uniform in a plan view and/or in a sectional view. In a plan view, the inner portion 150b is formed only on a portion of the inner lateral surface of the holes 163, 165, and 166 of the third insulating layer 160, and the deposited thickness of the inner portion 150b is not constant in a sectional view.

FIG. 24 shows an example in which the capping layer 150 not covered by the data conductors 173, 175, and 176 is disposed on the third insulating layer 160, and FIG. 25 shows an example in which the data conductors 173, 175, and 176 and the capping layer 150 together expose the upper surface of the third insulating layer 160. In the case of the embodiment of FIG. 25, the upper surface of almost the entirety of the capping layer 150 disposed on the upper surface of the third insulating layer 160 may be overlapped by the data conductors 173, 175, and 176.

Now, referring to FIG. 26 to FIG. 29 as well as FIG. 24 and FIG. 25, a manufacturing method of a TFT array panel of a display device according to an embodiment will be described.

FIG. 26 to FIG. 29 are each cross-sectional views sequentially showing processes of a manufacturing method of a TFT array panel shown in FIG. 24 or FIG. 25.

Figure 26:
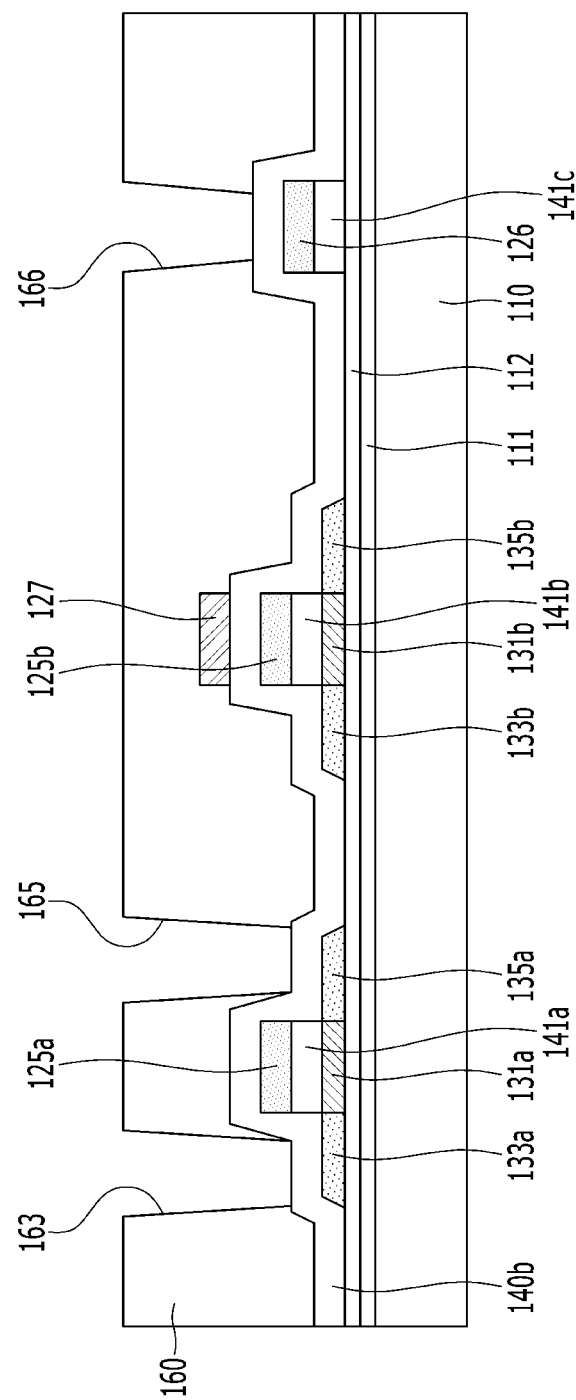
FIG. 26 to FIG. 29 are each a cross-sectional view sequentially showing processes of a manufacturing method of a TFT array panel of a display device shown in FIG. 24 or FIG. 25.

First, referring to FIG. 26, the steps shown in FIG. 18 to FIG. 21 as previously described are performed.

Figure 27:
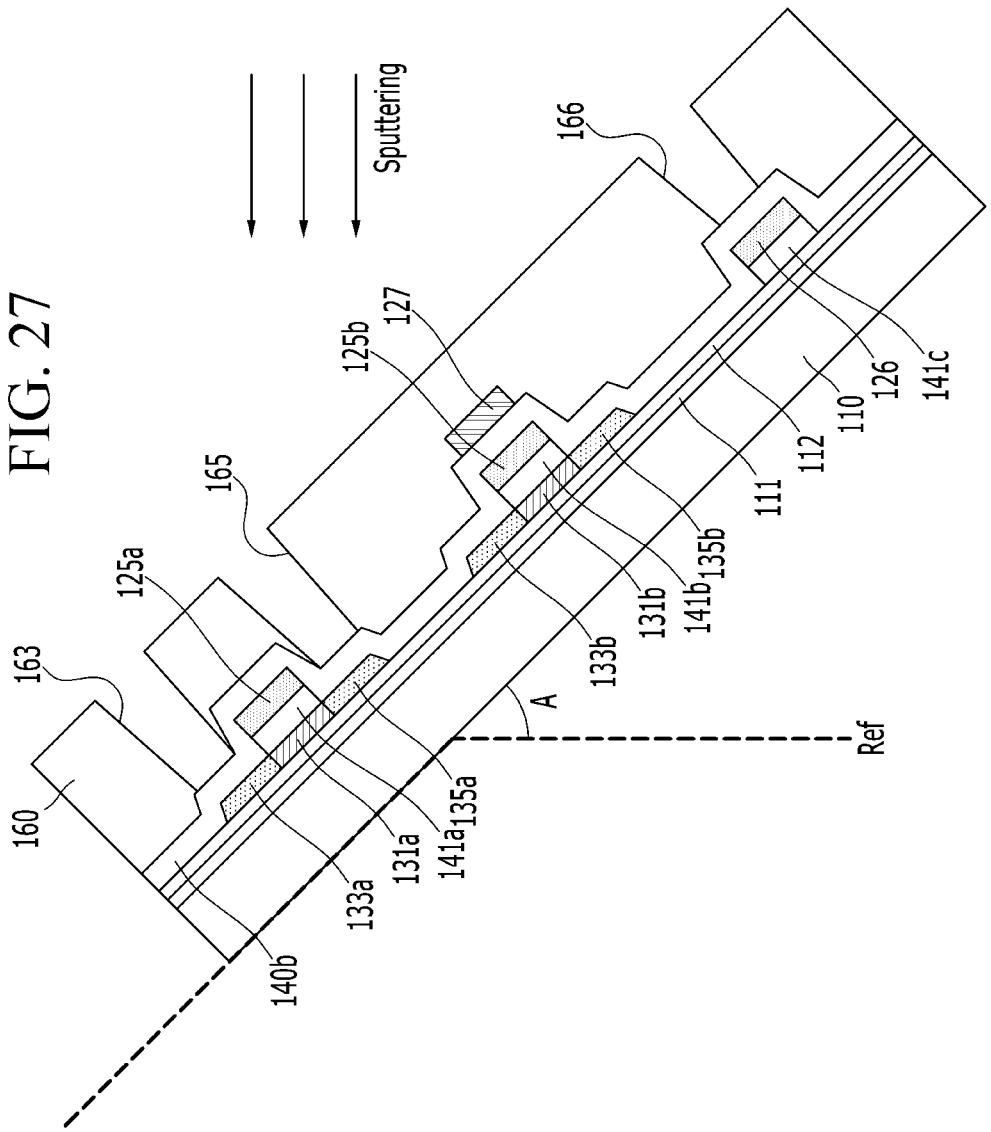
Figure 28:
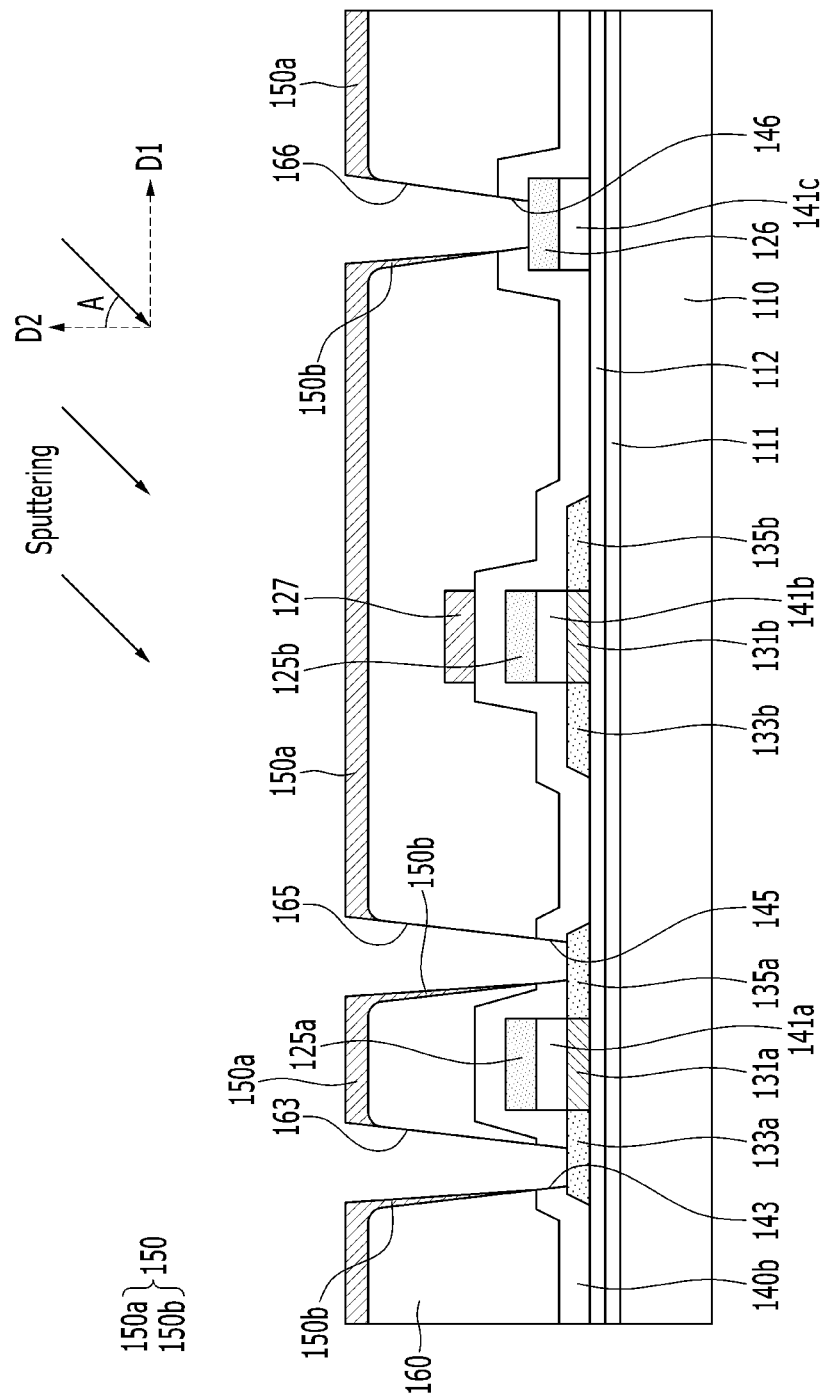

Then, referring to FIG. 27 and FIG. 28, the first substrate 110 is tilted so that a planar surface of the first substrate 110 may form an angle A with reference to a reference direction Ref, and then a material for the capping layer is deposited using a method such as, for example, sputtering. In this process, the direction in which the material for the capping layer comes mainly may form an angle of about 80 degrees to about 100 degrees, or about a right angle, with the reference direction Ref, as shown in FIG. 27. Referring to FIG. 28, if a direction parallel to the surface of the first substrate 110 is referred to as a first direction D1, and a direction normal to the surface of the first substrate 110 is referred to as a second direction D2, the angle formed by the direction in which the material for the capping layer mainly comes and the second direction D2 may be equal to the angle A.

The angle A may be about 60 degrees to about 70 degrees, but is not limited thereto, and may be an appropriate angle greater than 0 degrees and less than about 90 degrees. The appropriate angle may mean an angle at which the material for the capping layer is not deposited on the upper surface of the second insulating layer 140b exposed by the holes 163, 165, and 166 of the third insulating layer 160 when forming the capping layer 150. In this process, a small amount of the material for the capping layer may be deposited on the second insulating layer 140b exposed by the holes 163, 165, and 166 of the third insulating layer 160, but the deposited degree should be at a degree that the first and second insulating layers 140a and 140b exposed by the holes 163, 165, and 166 of the third insulating layer 160 may be sufficiently etched while maintaining the capping layer 150 in the following process.

Since the angle A is greater than 0 degrees, the direction normal to the surface of the first substrate 110 and the direction in which the material for the capping layer is sputtered and mainly comes are not parallel to each other.

The material for the capping layer may include an inorganic insulating material such as, for example, silicon oxide (SiO$_x$), silicon nitride (SiN$_x$), and the like, or a metal.

Accordingly, the capping layer 150 including the upper portion 150a deposited on the upper surface of the third insulating layer 160 and the inner portion 150b deposited on the inner lateral surface of the holes 163, 165, and 166 of the third insulating layer 160 is formed on the first substrate 110.

Since the material for the capping layer is deposited while the first substrate 110 is tilted, the inner portion 150b of the capping layer 150 is formed only on a portion of the inner lateral surface of the holes 163, 165, and 166 of the third insulating layer 160, and the capping layer 150 is not formed on at least a portion of the opposing surface. In addition, since a quantity of the arriving material for the capping layer varies according to the depth in the holes 163, 165, and 166 of the third insulating layer 160, the deposited thickness of the inner portion 150b of the capping layer 150 may be different depending on the depth in the holes 163, 165, and 166 of the third insulating layer 160. The deposited thickness of the inner portion 150b may be thinner closer to the first substrate 110 in the holes 163, 165, and 166 of the third insulating layer 160. In addition, the deposited thickness of the upper portion 150a may be greater than or equal to the maximum deposited thickness of the inner portion 150b.

Figure 29:
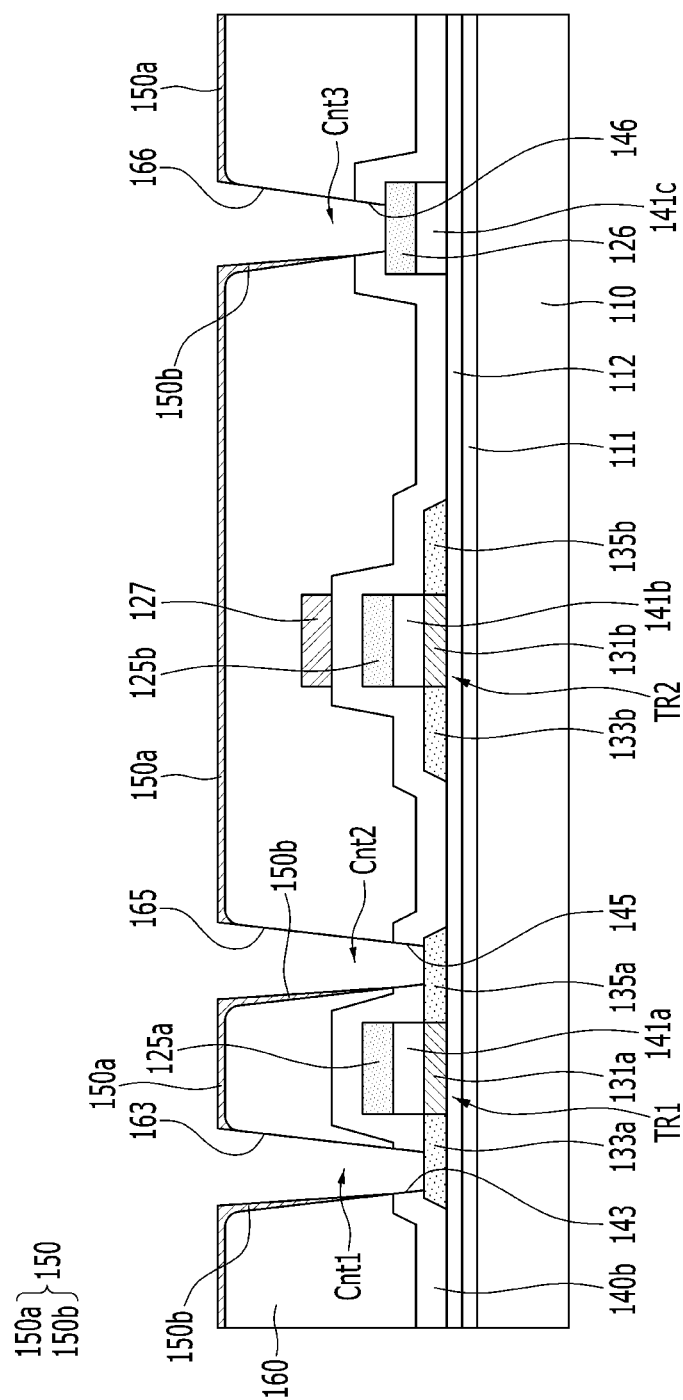

Next, referring to FIG. 29, the capping layer 150 and the first and second insulating layers 140a and 140b which are not covered by the third insulating layer 160 and are exposed are removed by a method such as etching, to form holes 143 and 145 exposing at least one electrode of the TFTs TR1 and TR2, and a hole 146 exposing the first conductor 126 or the second conductor 127. As such, the contact holes Cnt1, Cnt2, and Cnt3 are formed. In this process, a portion of the capping layer 150 is also etched so that the thickness of the capping layer 150 may be thinner.

According to the present embodiment, since during the etching process of the first and second insulating layers 140a and 140b for forming the contact holes Cnt1, Cnt2, and Cnt3, most of the third insulating layer 160 around the portion of the first and second insulating layers 140a and 140b which is being etched is covered by the capping layer 150, the material included by the third insulating layer 160, particularly, the organic material of the third insulating layer 160 when the third insulating layer 160 includes an organic material, may not be removed. Accordingly, generation of a remaining layer on the electrode exposed by the contact holes Cnt1, Cnt2, and Cnt3 by the material of the third insulating layer 160 may be prevented. Thus, an increase of contact resistances at the contact holes Cnt1, Cnt2, and Cnt3 may be prevented, and deterioration of characteristics of the TFTs TR1 and TR2 may be prevented.

In addition, an additional patterning process for forming the capping layer 150 is not necessary such that the manufacturing process may be much simpler, and the manufacturing time and cost may be further reduced.

Since the third insulating layer 160 is not damaged or lost during the etching process of the first and second insulating layers 140a and 140b, the thickness W between the upper surface of the second conductor 127 which is closest to the upper surface of the third insulating layer 160, and the upper surface of the third insulating layer 160, may be prevented from being thinner. Therefore, electrical connection and a short circuit between the second conductor 127 and a conductor to be formed on the third insulating layer 160 may be prevented.

The subsequent processes may be the same as the previously described manufacturing method according to various embodiments.

A display device according to an embodiment may include the TFT array panel of various embodiments as described above, and a manufacturing method of a display device may include processes according to the manufacturing methods of the TFT array panel of embodiments as described above. The display device may be one of a liquid crystal display, an organic light emitting display, etc. The organic light emitting display may include a light emitting diode, a driving TFT electrically connected to the light emitting diode, and at least one switching TFT connected to the driving TFT, wherein the driving TFT may have a structure as the TFT TR1 of various embodiments, and the at least one switching TFT may have a structure as the TFT TR1 or the TFT TR2 of various embodiments.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A display device including a TFT array panel, comprising:
   a first substrate;
   a first electrode disposed on the first substrate;
   a first insulating layer including a first hole, the first insulating layer disposed on the first electrode;
   a second insulating layer disposed on the first insulating layer and including a second hole corresponding to the first hole; and
   a capping layer including a first inner portion disposed on an inner lateral surface forming the second hole of the insulating layer, the first inner portion contacting the inner lateral surface,
   wherein a portion of the first inner portion corresponding to the first hole is removed, and an end portion of the first inner portion disposed in the second hole is separated from the first electrode.

2. The display device of claim 1, wherein: a planar size of the second hole is greater than a planar size of the first hole.

3. The display device of claim 2, wherein: the capping layer comprises an upper portion which is disposed on an upper surface of the second insulating layer and connected with the first inner portion.

4. The display device of claim 3, further comprising: a conductor disposed on the capping layer and connected with the first electrode through the first hole and the second hole.

5. The display device of claim 4, wherein: the upper portion comprises at least a portion overlapping the conductor and a portion not overlapping the conductor.

6. The display device of claim 5, further comprising:
   a third insulating layer disposed between the first insulating layer and the second insulating layer, and including a third hole corresponding to the first hole and the second hole; and
   a second electrode disposed between the first insulating layer and the third insulating layer,
   wherein the third insulating layer further includes a fourth hole disposed on the second electrode,
   wherein the second insulating layer further includes a fifth hole corresponding to the fourth hole, and
   wherein the capping layer further includes a second inner portion on an inner lateral surface forming the fifth hole.

7. The display device of claim 5, wherein: the capping layer includes a cutout disposed on an upper surface of the second insulating layer.

8. The display device of claim 1, wherein: a thickness of the first inner portion disposed in the second hole is not uniform.

9. The display device of claim 8, wherein: the inner lateral surface of the second insulating layer forming the second hole includes a first surface on which the first inner portion is disposed and a second surface facing the first surface, and wherein the capping layer is not disposed on the second surface.

10. The display device of claim 8, wherein: a thickness of the first inner portion is thinner closer to the first substrate.

11. The display device of claim 9, wherein: the capping layer further comprises an upper portion disposed on an upper surface of the second insulating layer, and connected with the first inner portion.

12. The display device of claim 11, further comprising: a conductor disposed on the capping layer and connected with the first electrode through the first hole, wherein the conductor covers an upper surface of the upper portion.

13. The display device of claim 1, wherein: the capping layer is not disposed on an inner lateral surface of the first insulating layer forming the first hole.

14. A manufacturing method for a display device of a TFT array panel, the method comprising:
   forming a first electrode on a first substrate;
   forming a first insulating layer on the first electrode;
   forming a second insulating layer on the first insulating layer;
   forming a first hole in the second insulating layer;
   forming a capping layer on the second insulating layer;
   removing a portion of the capping layer disposed in the first hole; and
   forming a second hole corresponding to the first hole by removing the first insulating layer corresponding to the removed portion of the capping layer in the first hole.

15. The method of claim 14, wherein: a photomask used for forming the first hole and a photomask used for removing the portion of the capping layer disposed in the first hole are the same.

16. The method of claim 14, wherein:
   a photomask used when removing the portion of the capping layer disposed in the first hole comprises three regions with different transmittances from each other, and
   wherein when removing of the portion of the capping layer disposed in the first hole, a cutout exposing an upper surface of the second insulating layer is formed.

17. The method of claim 14, wherein: a thickness of the capping layer formed on the inner lateral surface of the second insulating layer forming the first hole is not uniform.

18. The method of claim 17, wherein: the inner lateral surface of the second insulating layer forming the second hole includes a portion on which the capping layer is not formed.

19. The method of claim 18, wherein: a thickness of the capping layer formed on the inner lateral surface of the second insulating layer is thinner closer to the first substrate.

20. The method of claim 14, further comprising: forming a conductor connected with the first electrode through the first hole and the second hole.

21. The method of claim 20, wherein: a portion of the capping layer is removed such that an upper surface of the second insulating layer is exposed.

* * * * *